(12) United States Patent
Zhang

(10) Patent No.: US 8,488,318 B2
(45) Date of Patent: Jul. 16, 2013

(54) COOLING SYSTEM FOR COMPUTER, COOLING APPARATUS AND COOLING METHOD

(76) Inventor: Wen Zhang, Deyang (CN)

( * ) Notice: Subject to any disclaimer, the term of this patent is extended or adjusted under 35 U.S.C. 154(b) by 484 days.

(21) Appl. No.: 12/681,103

(22) PCT Filed: Aug. 27, 2008

(86) PCT No.: PCT/CN2008/072175
§ 371 (c)(1),
(2), (4) Date: Mar. 31, 2010

(87) PCT Pub. No.: WO2009/046647
PCT Pub. Date: Apr. 16, 2009

(65) Prior Publication Data
US 2010/0214736 A1 Aug. 26, 2010

(30) Foreign Application Priority Data
Oct. 12, 2007 (CN) .......................... 2007 1 0182240

(51) Int. Cl.
*H05K 7/20* (2006.01)
(52) U.S. Cl.
USPC .......................................... 361/695; 361/703
(58) Field of Classification Search
USPC ..................... 361/679.46, 694, 695
See application file for complete search history.

(56) References Cited

U.S. PATENT DOCUMENTS

| | | | |
|---|---|---|---|
| 5,297,005 A * | 3/1994 | Gourdine ...................... | 361/697 |
| 6,113,485 A * | 9/2000 | Marquis et al. ............... | 454/184 |
| 6,375,561 B1 * | 4/2002 | Nicolai et al. ................ | 454/184 |
| 6,404,630 B1 * | 6/2002 | Lai ................................ | 361/697 |
| 6,791,837 B2 * | 9/2004 | Chen et al. .................... | 361/695 |
| 6,920,044 B2 * | 7/2005 | Lin ................................ | 361/697 |
| 6,940,716 B1 * | 9/2005 | Korinsky et al. .............. | 361/695 |
| 6,987,669 B2 * | 1/2006 | Chen ............................. | 361/695 |
| 7,286,350 B2 * | 10/2007 | Lee et al. ...................... | 361/695 |
| 7,428,149 B2 * | 9/2008 | Cheng et al. .................. | 361/690 |

\* cited by examiner

*Primary Examiner* — Gregory Thompson

(57) ABSTRACT

A cooling system for computer, a cooling apparatus and a cooling method are described. The cooling system includes a computer casing, a fan and the fan-less cooling apparatus. The fan-less cooling apparatus has an air passage with two open ends and a closed circumference. The air passage passes a heat dissipating part of the apparatus, one end of the air passage communicates with air outside the computer casing and the other end communicates with air inside the computer casing. a plurality of blowholes for the fan and the air passage are formed in the computer casing. There is at least one fan. Air is blown inside or outside through the blowholes, which causes a pressure difference between the interior and the exterior of the computer casing. The pressure difference leads an air flow to flow through the blowholes to dissipate heat.

17 Claims, 20 Drawing Sheets

COOLING SYSTEM FOR COMPUTER, COOLING APPARATUS AND COOLING METHOD

BACKGROUND OF THE PRESENT INVENTION

1. Field of Invention

The present invention relates to a heat dissipation technology, and more particularly to a cooling system for computer, a cooling apparatus and a cooling method.

2. Description of Related Arts

Electronic products are widely used for all aspects of production and life in the contemporary society. The system performance of electronic products and user's experience directly bear on the efficiency of social production and people's life quality. The computer occupies an important position in the electronic product. The electronic components of the computer produce heat at run time, wherein, the high-heat electronic component must be installed with a cooling apparatus in order to maintain its operation temperature within a permissible range, or the high operation temperature will lead the performance to reduce or even failure. The high-heat electronic component of the existing computer mainly includes a CPU (Central Processing Unit) disposed on a mainboard, a GPU (graphic processing unit) disposed on a graphic card, a power electronic component disposed in a power supply and so on, here, the mainboard, the graphic card and the power supply are parts. Sometimes, the computer's hard disk and other parts also need cooling.

The electronic component or part of the existing computer generally uses a fan cooling apparatus to dissipate heat. The fan cooling apparatus mainly consists of a radiator disposed on the electronic component or part of the existing computer and a radiating fan disposed on the radiator. The radiator absorbs heat from the electronic component, the radiating fan causes an airflow, and the airflow passes the radiator and takes heat away from the radiator. Here, the radiating fan enhances the heat dissipating effect. Generally, except the power supply, each fan cooling apparatus releases heat into the computer casing. a fan disposed on the computer casing blows air outside in order to further release the heat within the computer casing to the exterior. For a general configuration computer, the heat is released out of the computer casing through a fan of the power supply which blows air outside.

The computer casing of the existing computer is mainly used to fix and protect the computer components, such as the mainboard, the power supply and the graphic card. The computer casing creates an electromagnetic shielding effect, and makes the computer look attractive. Basically, the computer casing has no effect to dissipate heat, because the computer will still work properly if all computer components are disposed on a flat board and connected with each other, and the heat dissipating effect is even better when there is no computer casing.

As we all know, the fan causes noise at run time, and more fans, more noise. For the existing computer, the high-heat electronic components, such as the CPU, the GPU and the power electronic component, generally use the fan as cooling apparatus, a large number of fans cause great noise at run time. Noise is harmful to human health and reduces work efficiency.

Therefore, while keeping heat dissipating effect, to minimize the noise of the cooling system has become an big problem for the computer industry. Because the low-speed large-diameter fan not only has a low-noise characteristic, but also meets the requirement of heat dissipation, so people have designed and produced a variety of fan cooling apparatus having a larger diameter for the CPU, the graphic card and the power supply. At present, the radiating fan for the power supply usually has diameter of 120 mm, or even 140 mm by some manufacturer; the radiating fan even having a special structure for the CPU also can reach 120 mm in diameter, but the most radiating fans for the CPU are about 80 mm or 90 mm in diameter; the radiating fan for the graphic card is usually less than 60 mm in diameter due to limited space; the radiating fan installed on the computer casing usually is 80 mm, 90 mm or 120 mm in diameter; usually, there are two fans with a diameter of 60 mm for the hard disk, the radiating fan blows to the surface of the hard disk to dissipate heat.

The large diameter and the low speed of the fan are capable of reducing noise, but the reduction degree of noise is very limited because large number of the radiating fans and the diameter of the radiating fan has different size. So the noise of the computer is still a problem for the computer industry.

In recent years, a HTPC (home theater personal computer) with remote control function has a trend to become a home entertainment center. Undoubtedly, the entertainment of the HTPC and the noise of the computer are incompatible. Till now, there is no noisy solution for HTPC. Therefore, the HTPC also has strong requirement for low-noise for the cooling system. Other electronic products with the high-heat electronic component, such as electronic game and so on, also have the problem to further reduce noise while meet the requirement of heat dissipation.

SUMMARY OF THE PRESENT INVENTION

A main object of the present invention is to provide a cooling system for computer and a fan-less cooling apparatus, the noise of the computer which uses the cooling system and the fan-less cooling apparatus to dissipate heat is obviously lower than the existing cooling methods, and the heat dissipating effect is good.

the other object of the present invention is to provide a cooling method, the electronic product using the cooling method has better heat dissipating effect and lower noise.

Accordingly, in order to accomplish the above objects, the present invention provides the following project.

A cooling system for computer comprises a computer casing, a fan and a fan-less cooling apparatus, wherein the fan-less cooling apparatus has an air passage with two open ends and a closed circumference, the air passage passes a heat dissipating part of the fan-less cooling apparatus, one end of the air passage communicates with air outside the computer casing, and the other end of the air passage communicates with air inside the computer casing; the computer casing has a plurality of blowholes used for the fan and a plurality of blowholes used for the air passage; there is at least one fan, the fans uniformly blow air outside or inside through the blowholes so as to form an air pressure difference between interior and exterior of the computer casing, the air pressure difference leads an airflow to pass the air passage and the blowholes used for the air passage.

A fan-less cooling apparatus has an air passage with two open ends and a closed circumference, the air passage passes a heat dissipating part of the fan-less cooling apparatus.

A cooling method comprises the steps of: providing an air passage traversing a heat dissipating part of a cooling apparatus; forming a non-fully sealed computer casing; disposing the electronic component needing to be cooled and the cooling apparatus with the air passage within the computer casing; achieving a running of an airflow between the interior and the exterior of the computer casing, wherein the airflow passes the air passage.

With the above projects, the cooling system of the present invention comprises a computer casing, a fan and a fan-less cooling apparatus, wherein the fan-less cooling apparatus is mounted on the electronic component needing to be cooled, and has an air passage with two open ends and a closed circumference, the air passage passes a heat dissipating part of the fan-less cooling apparatus, one end of the air passage communicates with the air outside the computer casing, and the other end of the air passage communicates with the air inside the computer casing; the computer casing has a plurality of blowholes used for the fan and a plurality of blowholes used for the air passage, with the condition that other parts are almost sealed, the computer casing has a good leak tightness; the fans uniformly blow air outside or inside, when the fan blows air outside, the air pressure inside the computer casing is lower than the air pressure inside the computer casing, such that the air outside the computer casing inpours into the air passage of the fan-less cooling apparatus through the blowholes of the computer casing, the heat is transferred, and the air is released out of the computer casing by the fan; when the fan blows air inside, the air pressure inside the computer casing is higher than the air pressure inside the computer casing, such that the air inside the computer casing inpours into the air passage of the fan-less cooling apparatus, the heat is transferred, and the air is released out of the computer casing.

In the cooling system, there is at least one fan which causes the air pressure between the interior and the exterior of the computer casing, a number of the fans can be large than, equal to or less than a number of the fan-less cooling apparatuses. In order to reduce noise, with meeting the condition of the heat dissipation, the number of the fan is as few as possible. The heat dispersion of the fan can be approximately calculated with the following method.

For example, for an ordinary fan with a diameter of 120 mm, when the rotation speed is 1300 rpm, the air quantity is about 50 CFM (Cubic Feet per Minute, 1 CFM=4.72×10−4 m3/s). The airflow temperature is 28° C. when the airflow inpours into the computer casing, the airflow temperature is 38° C. when the airflow outpours out of the computer casing, the temperature difference is 10° C., as a result, in unit time, the heat released by the fan with a diameter of 120 mm is: (specific heat of air: 1.005 J/g.K, specific weight of air: 1290 g/m3)

$$\begin{aligned} Q &= c \cdot m \cdot \Delta t \\ &= 1.005 \times (50 \times 4.72 \times 10\text{-}4 \times 1290) \times 10 \\ &= 305.96 \text{ W} \end{aligned}$$

At present, the heat produced by most computers is less than 300 W.

The calculation result indicates that one fan is enough to provide a good heat dissipating effect for the whole computer by using the cooling system and doesn't cause high temperature within the computer casing.

And, according to the heat design philosophy of the electronic product, the total heat dissipated by the forced wind cooling does not only refers to air quantity passing the cooling apparatus, but also refers to the heat dissipating area of the cooling apparatus and the temperature difference between the air temperature and the temperature of the heat dissipating surface of the cooling apparatus. In the cooling system, several fan-less cooling apparatuses share few fans, such that the air quantity passing single fan-less cooling apparatus is reduced, but because the heat dissipating area of the cooling apparatus can be large and the air passing the fan-less cooling apparatus comes from the exterior of the computer casing, the heat dissipating effect of the fan-less cooling apparatus using common fan has an approximative level with the heat dissipating effect of ordinary cooling apparatus using single fan.

With the above analysis, in the cooling system, the computer casing, the fan and the fan-less cooling apparatus form an organic whole, cooperate with each other, and get a good balance between the heat dissipating effect and the noise. Generally, other blowholes of the computer casing is less, the air quantity passing the air passage is more, the number of the fan is less, there can be only one large-diameter silent fan with a diameter of 120 mm in a computer casing having better leak tightness, such that the noise of the computer is obviously reduced.

The cooling method uses the fan to cause the air pressure difference between the interior and the exterior of the computer casing so as to achieve the running of the airflow between the interior and the exterior of the computer casing, the airflow passes the air passage of the fan-less cooling apparatus and the heat is transferred. Because while meeting the requirement of heat dissipation, the cooling uses few fans to achieve running of airflow for dissipating heat, the noise is low.

The cooling method can not only be used for the computer, but also be used for other products, such as electronic products and communicating products, the heat dissipating effect is good and the noise is low.

DETAILED DESCRIPTION OF THE PREFERRED EMBODIMENT

For the purpose, technical project and advantage of the present invention more clearly understood, the present invention is further detailedly described by the following drawings and embodiments, and the relevant parts of related arts used to explain the present invention are also described, the other parts are omitted. The drawings are only used for reference and description, not used for limiting the present invention. In the embodiment of the present invention, the same label shows same or similar element.

A cooling system for computer and a cooling apparatus according to a preferred embodiment of the present invention is illustrated, which use an air pressure difference between an interior and an exterior of a computer casing to form an airflow within an air passage for dissipating heat, instead of directly using a fan for dissipating heat, wherein, the air pressure difference is formed by the sealed computer casing and the fan which blows air outside or inside. Therefore, the fan which causes the air pressure difference is a common fan in the cooling system and the fan-less cooling apparatus, such that the number of the fan is reduced, and then the computer noise is reduced.

The embodiments of the cooling system for computer and the fan-less cooling apparatus are respectively described below.

The first preferred embodiment of the cooling system is described below.

The first preferred embodiment of the cooling system comprises a CPU fan-less cooling apparatus, a graphic card fan-less cooling apparatus, a hard disk fan-less cooling apparatus, a power supply fan-less cooling apparatus, a radiating fan and a computer casing.

In the first preferred embodiment of the cooling system, the CPU fan-less cooling apparatus has four embodiments described below.

A first preferred embodiment of the CPU fan-less cooling apparatus is described below.

Figure 1:
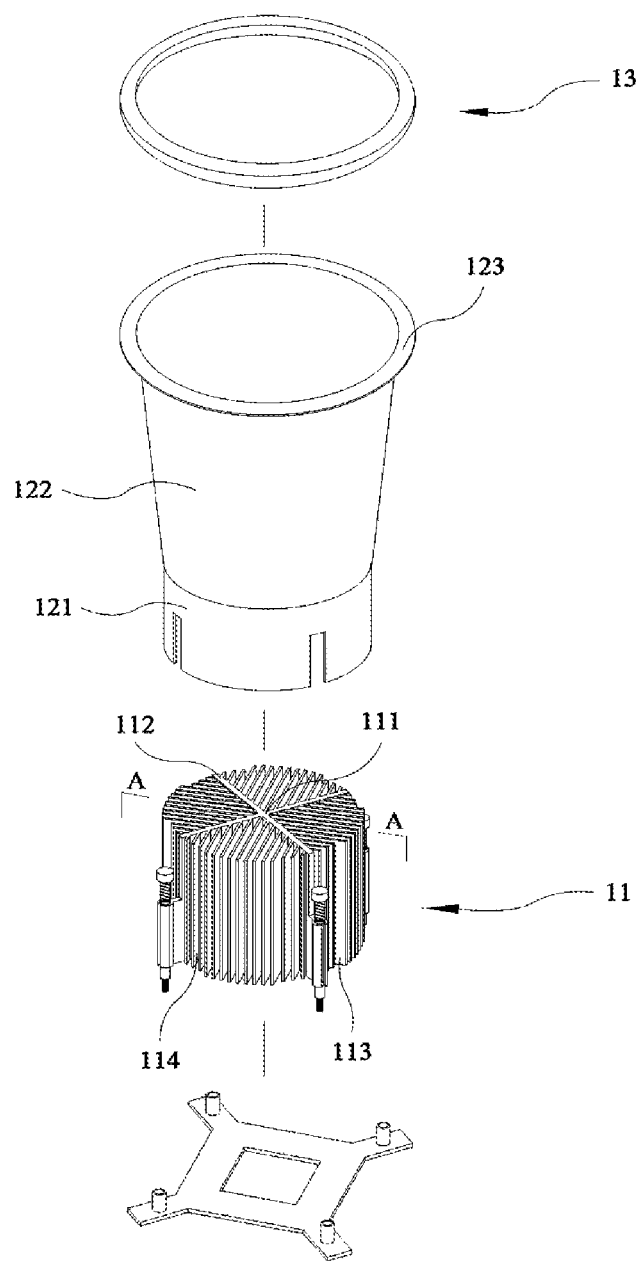
FIG. 1 is an exploded view of a CPU fan-less cooling apparatus according to a first preferred embodiment of the present invention.

FIG. 1 is an exploded view of the CPU fan-less cooling apparatus according to the first preferred embodiment. The CPU fan-less cooling apparatus comprises a radiator 11, a shield 121, a wind pipe 122 and a sponge 13. The radiator 11 is a heat dissipating part of the CPU fan-less cooling apparatus. The radiator 11 comprises a pedestal 111, a base board 112 and a plurality of radiating fins 113, above three elements are as a whole. The pedestal 111 is positioned on a center of the radiator 11, and has a shape of cone or cylinder (FIG. 1 shows a cone), wherein, the subulate pedestal not only is favourable to heat conduction along the height of the radiator 11, but also reduces the weight of the radiator 11; the cylindrical pedestal is favourable to adopting copper-filled technic or inserting duct heater in order to enhance heat conduction. The base board 112 is cross-symmetrically disposed on the pedestal 111, and looks like X from top to bottom. The radiating fins 113 are symmetrically disposed on the pedestal 111 and the base board 112, and are parallel to the bisection planes of the angle with the base board 112. The radiator 11 needs be high enough, commonly, the radiator 11 is two to three times higher than a congeneric radiator used for a cooling apparatus having fan.

The shield 121 has two open ends and a closed circumference, and has a same shape with the radiator 11. The shield 121 is disposed on an exterior of the radiator 11 along an axle wire direction of the radiator 11, and aligns with an outer surface of the radiator 11. Generally, an exploded part of a lower half of the radiator 11 has an approximative height with the longest radiating fin 113 when the shield 121 is disposed on the exterior of the radiator 11. In comparison with the communicating mode that the interspace between the CPU fan-less cooling apparatus and the mainboard is only used, the communicating mode that using one end of an air passage 14 to communicate with the air inside the computer casing has a better heat dissipating effect. The wind pipe 122 has a shape of cone, the less end communicates with the shield 121, the other end contacts with the inner wall of the computer casing, wherein, the other end can directly contacts with the inner wall of the computer casing; the other end also can contacts the inner wall of the computer casing with a flange 123 disposed on the other end; further, the other end can contacts the inner wall of the computer casing with a sponge affixed on the flange 123. Using the tapered wind pipe is favourable to the airflow to pass the air passage 14. In the embodiment, the air passage 14 has two parts, a first air passage and a second air passage, wherein, the first air passage is formed by a plurality of grooves 114 between the radiating fins and the shield 121, the second air passage is formed by the wind pipe 122. The air passage 14 communicates with the exterior through a plurality of blowholes of the computer casing.

The flange 123 and the sponge 13 are alternative elements. Affixing the sponge 13 to the flange 123 is favourable to the contact between the CPU fan-less cooling apparatus and the inner wall of the computer casing, and reduces the contact requirement of the wind pipe 122 and the computer casing. The sponge 13 also can be replaced by other flexible material, such as soft material.

The shield 121 and the wind pipe 122 can be made respectively, the less end of the wind pipe 122 is dispose on the shield 121; or the shield 121 and the wind pipe 122 can be made together as an individual wind apparatus, one end of the wind apparatus is disposed on the exterior of the radiator and aligns with the outer surface of the radiator 11, the other end of the wind apparatus is closed to the inner wall of the computer casing.

A locking apparatus shown in FIG. 1 is used for Intel LGA775 series CPU.

Figure 2:
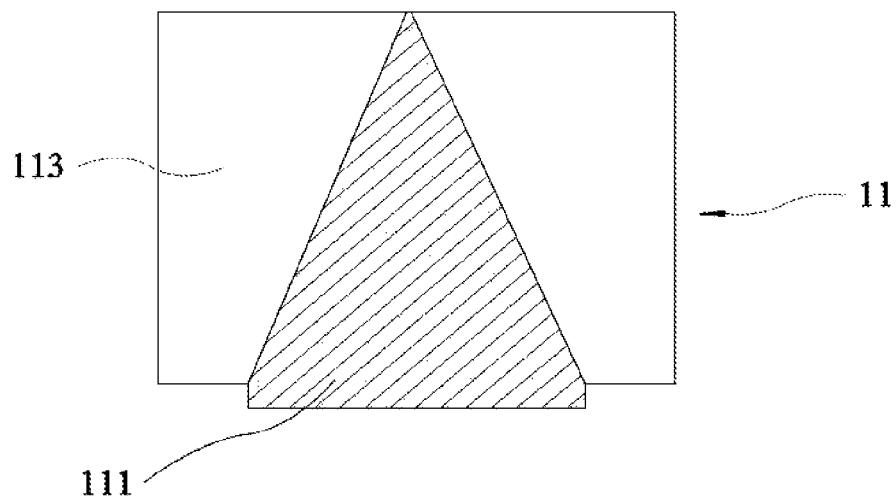
FIG. 2 is an A-A sectional view of a radiator in FIG. 1 of the present invention.

FIG. 2 is an A-A cutaway view of the radiator 11 in FIG. 1. In FIG. 2, No. 11 is the radiator, No. 113 is the radiating fin, No. 111 is the pedestal. The pedestal 111 shown in FIG. 1 has a shape of cone.

Figure 3:
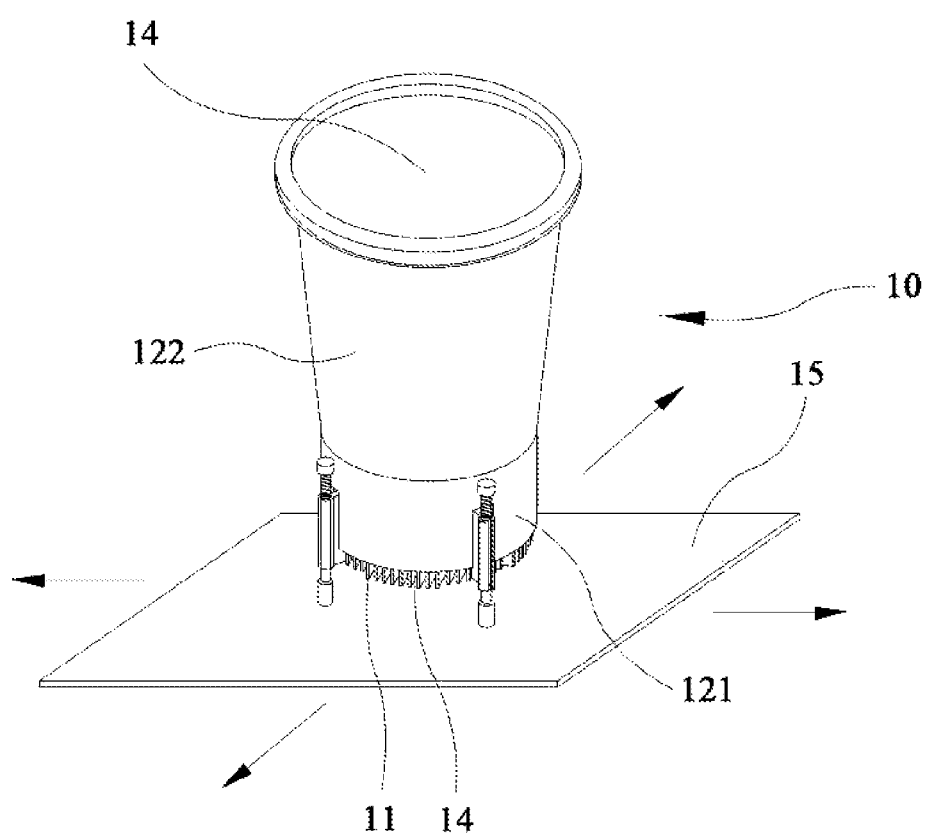
FIG. 3 is a combination view of the CPU fan-less cooling apparatus according to the first preferred embodiment of the present invention.

FIG. 3 is a combination view of the CPU fan-less cooling apparatus 10 according to the first preferred embodiment. In FIG. 3, the CPU fan-less cooling apparatus 10 is disposed on a mainboard 15, four arrowheads near the mainboard 15 show that the board shown in FIG. 3 is only a part of the mainboard 15. The air passage 14 is formed in the CPU fan-less cooling apparatus 10, has a closed circumference and two ends, one end of the shield 121 near to the mainboard 15 and one end of the wind pipe 122 far from the shield 121. The air passage 14 has two parts, the first air passage has a plurality of channels, which is formed by the shield 121 and the radiator 11, the second air passage a plurality of channels, which is formed by the wind pipe 122 and passes the heat dissipating part of the CPU fan-less cooling apparatus 10, the radiating fins 14 is between the channels of the first air passage.

A second preferred embodiment of the CPU fan-less cooling apparatus is described below.

Figure 4:
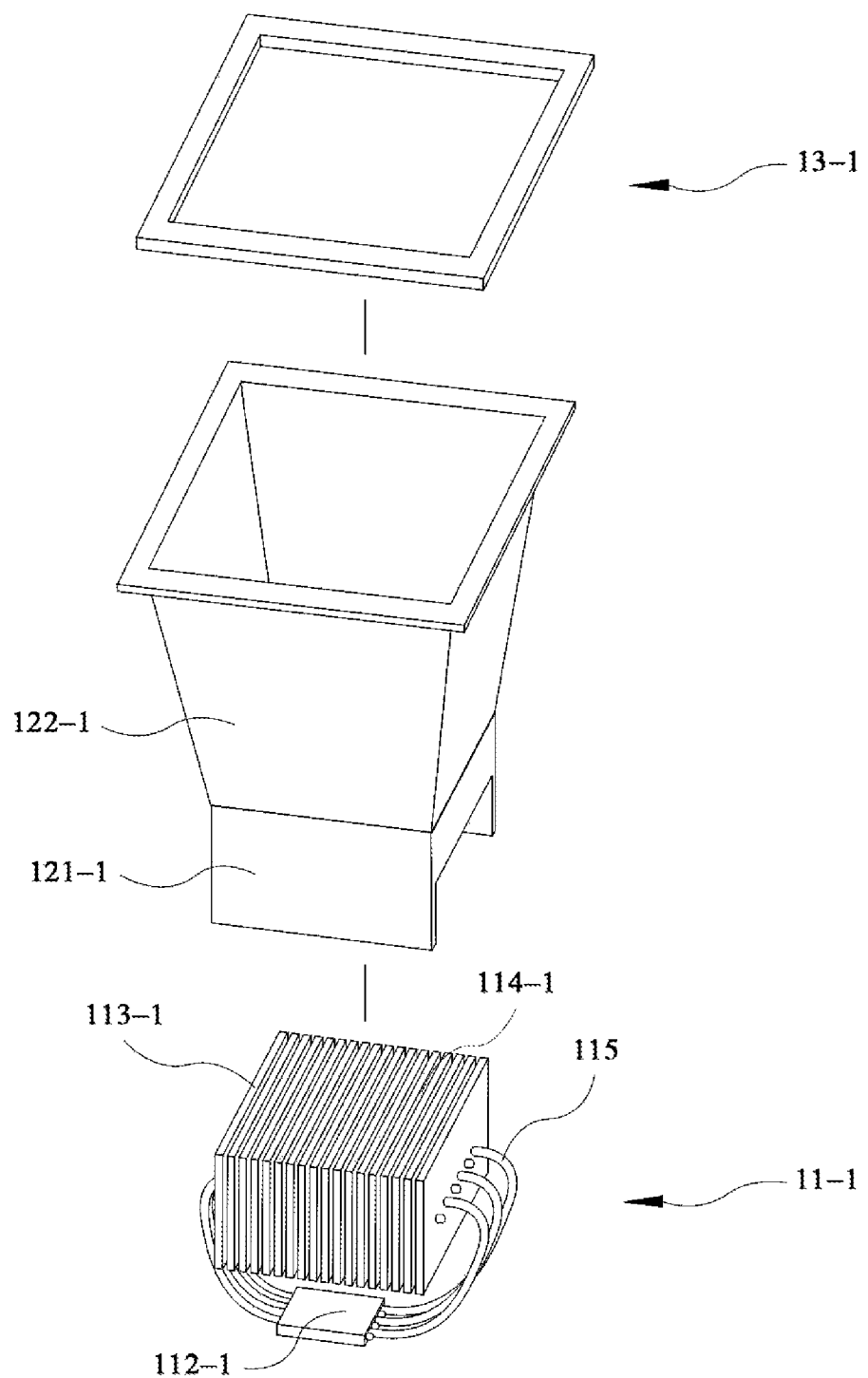
FIG. 4 is an exploded view of the CPU fan-less cooling apparatus according to a second preferred embodiment of the present invention.

FIG. 4 is an exploded view of the CPU fan-less cooling apparatus according to the second preferred embodiment. The following content only describes the different parts between the first preferred embodiment and the second preferred embodiment, the same or similar parts see the first preferred embodiment.

In FIG. 4, the CPU fan-less cooling apparatus comprises a radiator 11-1, a shield 121-1, a wind pipe 122-1 and a sponge 13-1. The radiator 11-1 is a heat dissipating part of the CPU fan-less cooling apparatus. The radiator 11-1 comprises a base board 112-1, a plurality of heat pipes 115 and a plurality of radiating fins 113-1. The radiating fins 113-1 are perpendicular to the base board 112-1; one segment of each heat pipe 115 inserts into or enters into the base board 112-1, one segment of each heat pipe 115 enters the radiating fins 113-1. The description of the shield 121-1, the wind pipe 122-1 and the sponge 13-1 sees the first preferred embodiment. The shield 121-1 is disposed on the exterior of the radiator 11-1 along the direction perpendicular to the base board 112-1, and aligns with an edge of the radiator 11-1. The shield 121-1 and the radiator 11-1 have an approximative height. A first air passage is formed by the shield 121-1 and a plurality of interspaces 114-1 between the radiating fins 113-1, a second air passage is formed by the wind pipe 122-1. The radiating fins 113-1 don't contact with the base board 112-1, generally, the distance between the top of the base board 112-1 and the bottom of the radiating fins 113 is more than 2 mm in order to make one end of the air passage communicate with the air inside the computer casing, in the second preferred embodiment, the distance is 20 mm.

Figure 5:
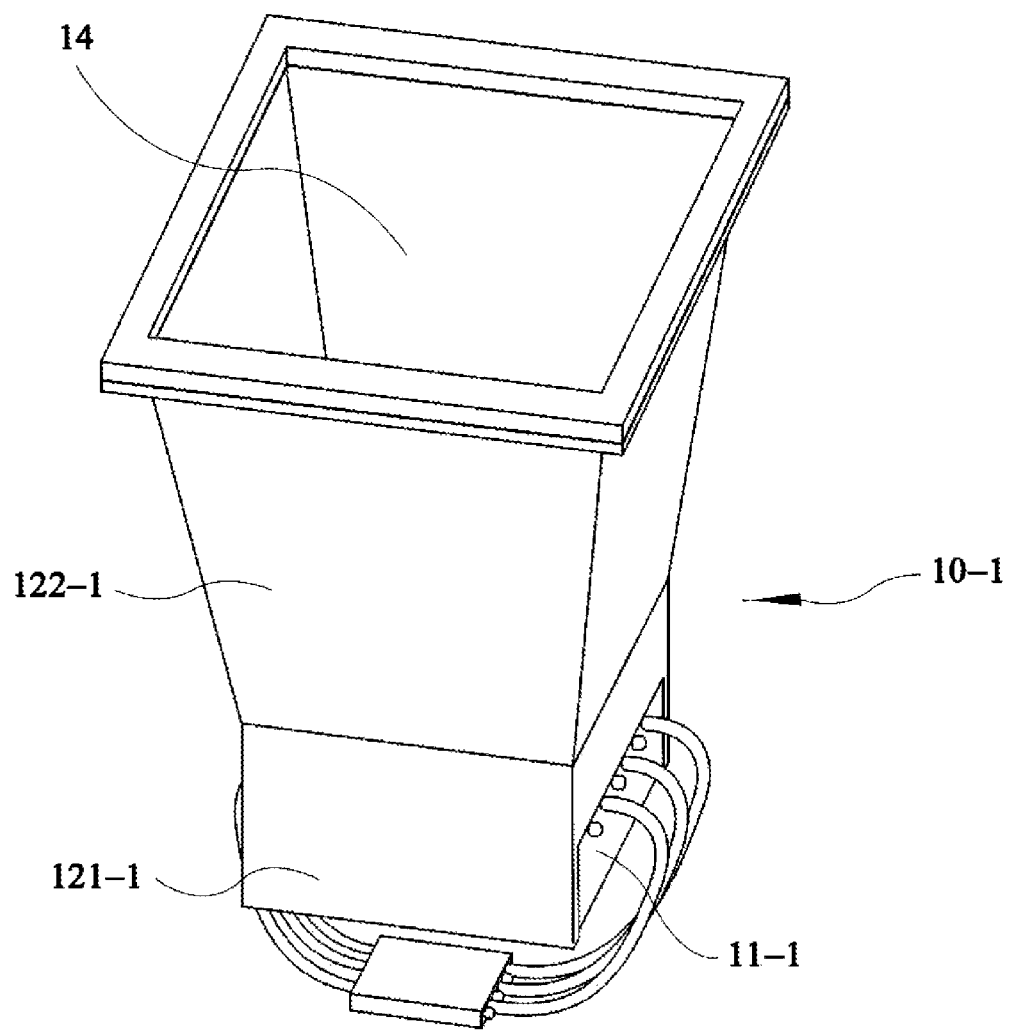
FIG. 5 is a combination view of the CPU fan-less cooling apparatus according to the second preferred embodiment of the present invention.

FIG. 5 is a combination view of the CPU fan-less cooling apparatus according to the second preferred embodiment. In FIG. 5, the air passage 14 of the CPU fan-less cooling apparatus 10-1 has two parts, the first air passage has a plurality of channels, which is formed by the shield 121-1 and the radiator 11-1, the second air passage having one channel is formed by the wind pipe 122-1.

The locking apparatus used for fixing the CPU fan-less cooling apparatus is not shown in FIG. 4 and FIG. 5.

A third preferred embodiment of the CPU fan-less cooling apparatus is described below.

Figure 6:
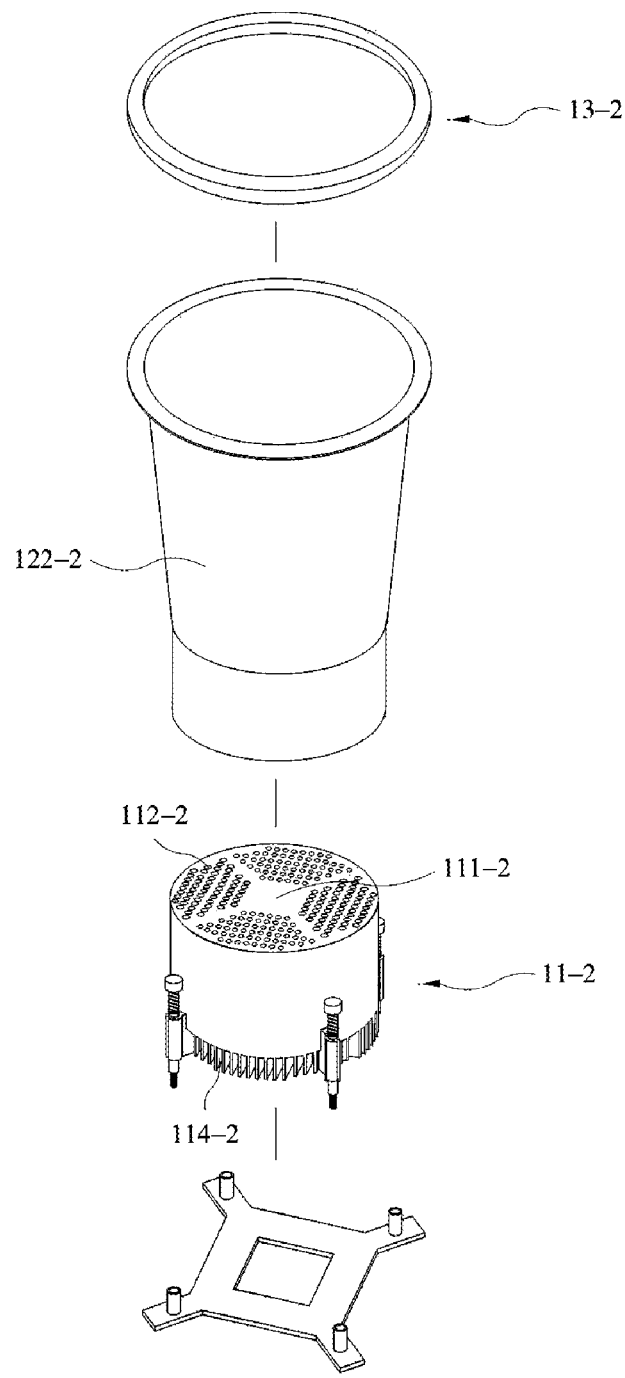
FIG. 6 is an exploded view of the CPU fan-less cooling apparatus according to a third preferred embodiment of the present invention.

FIG. 6 is an exploded view of the CPU fan-less cooling apparatus according to the third preferred embodiment. The following content only describes the different parts between the first preferred embodiment and the third embodiment, the same or similar parts see the first preferred embodiment.

In FIG. 6, the CPU fan-less cooling apparatus comprises a columnar radiator 11-2, a wind pipe 122-2 and a sponge 13-2. The columnar radiator 11-2 is a heat dissipating part of the CPU fan-less cooling apparatus. Around a central area 111-2 of the columnar radiator 11-2, a plurality of pylomes 112-2 are formed along the direction parallel to central line; around the central area 111-2 of the columnar radiator 11-2, a plurality of grooves 114-2 are formed on an lower end of the columnar radiator 11-2 and communicate with the pylomes 112-2, each groove has an hatch positioned on the edge of the columnar radiator 11-2; the central area 111-2 is positioned on the center of the columnar radiator 11-2 and has an approximative dimension with a calorifacient area of the electronic component which needs cooling. The communicating mode that one end of the air passage communicates with the air inside the computer casing through the grooves 114-2 has a better heat dissipating effect. One end of the wind pipe 122-2 which communicates with the pylomes 112-2 of the columnar radiator 11-2 is disposed on the exterior of the columnar radiator 11-2 along the axle wire direction of the columnar radiator 11-2, and aligns with the edge of the columnar radiator 11-2. The air passage comprises a first air passage and a second air passage, the first air passage is formed by the pylomes 112-2 of the columnar radiator 11-2, the second air passage is formed by the wind pipe 123-2.

The locking apparatus shown in FIG. 6 is adapted to Intel LGA775 series CPU.

Figure 7:
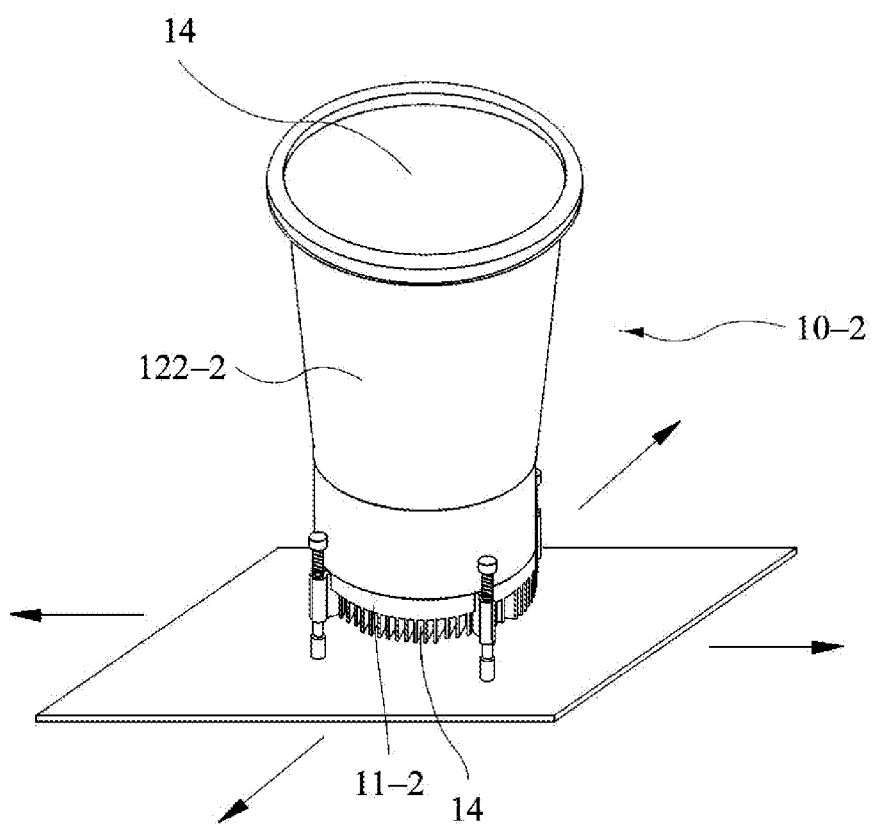
FIG. 7 is a combination view of the CPU fan-less cooling apparatus according to the third preferred embodiment of the present invention.

FIG. 7 is a combination view of the CPU fan-less cooling apparatus according to the third preferred embodiment. As shown in FIG. 7, the air passage 14 of the CPU fan-less cooling apparatus 10-2 comprises the first air passage and the second air passage, the first air passage has a plurality of channels, the second air passage has one channel.

A fourth preferred embodiment of the CPU fan-less cooling apparatus is described below.

Figure 8:
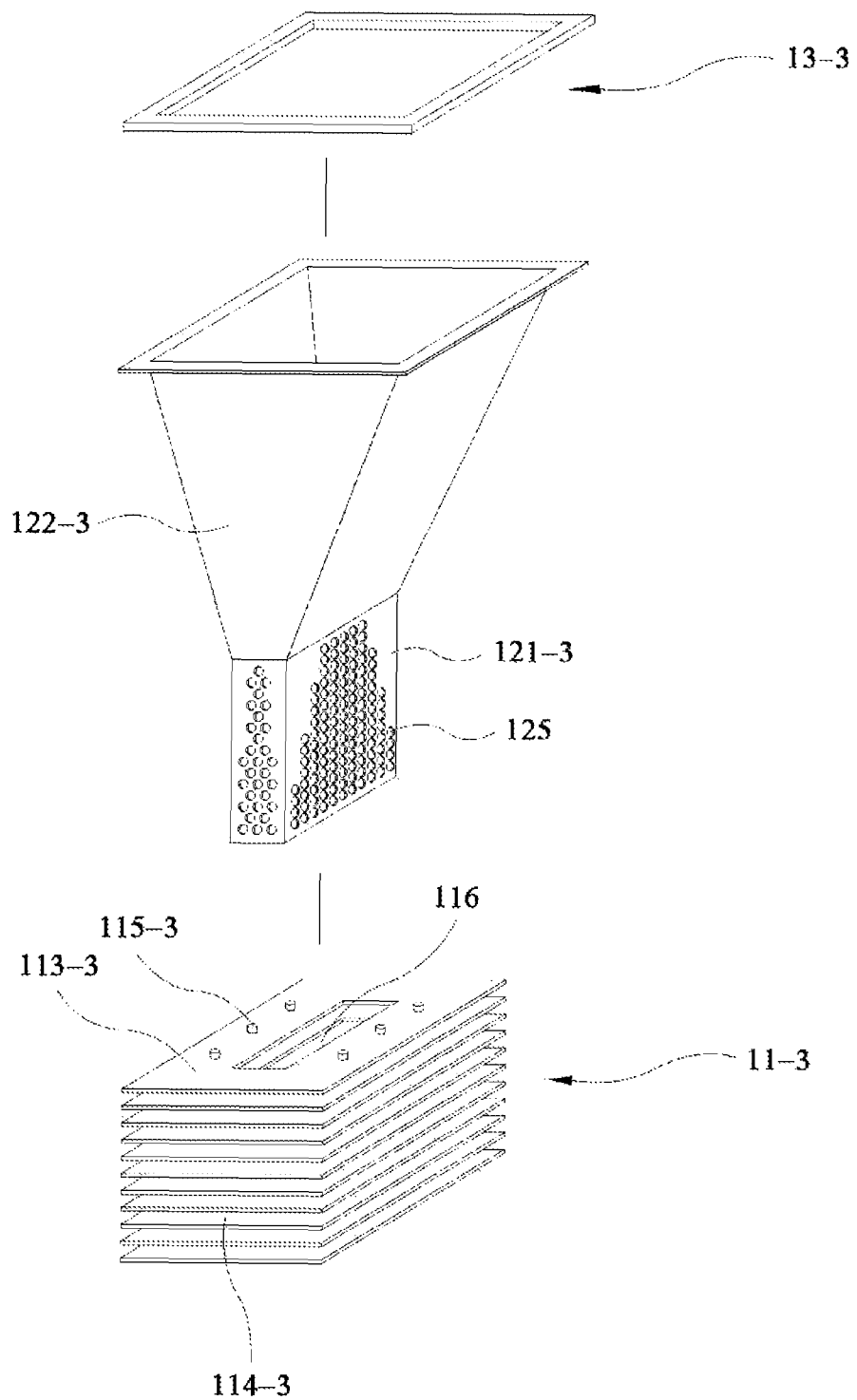
FIG. 8 is an exploded view of the CPU fan-less cooling apparatus according to a fourth preferred embodiment of the present invention.

FIG. 8 is an exploded view of the CPU fan-less cooling apparatus according to the fourth preferred embodiment. The following content only describes the different parts between the first preferred embodiment and the fourth embodiment, the same or similar parts see the first preferred embodiment.

In FIG. 8, the CPU fan-less cooling apparatus comprises a radiator 11-3, a shield 121-3, a wind pipe 122-3 and a sponge 13-3. The radiator 11-3 is a heat dissipating part of the CPU fan-less cooling apparatus. The radiator 11-3 comprises a base board (not shown in FIG. 8), a plurality of heat pipes 115-3 and a plurality of radiating fins 113-3, wherein the base board is positioned on the bottom of the radiator 11-3, and has a less area than the radiating fins 113-3, not seen in FIG. 8. The radiating fins are parallel to the base board, and have a window 116 on middle. One segment of each heat pipe 115-3 inserts into or enters into the base board, other segment of each heat pipe 115 passes the radiating fins 113-3. The shield 121-3 inserts into the window 116 of the radiating fins 113-3, a plurality of openings 125 are formed on the shield 121-3, a number of shield 121-3 gradually is reduced along the direction of the shield 121-3 which is far from the base board. The shield 121-3 and the radiator 11-3 have an approximative height. The wind pipe 122-3 has a shape of cone, a less end of the wind pipe 122-3 communicates with the shield 121-3. The air passage of the CPU fan-less cooling apparatus comprises a first air passage and a second air passage, the first air passage is formed by the shield 121-3 and a plurality of interspaces 114-3 between the radiating fins 113-3, the second air passage is formed by the wind pipe 122-3.

Figure 9:
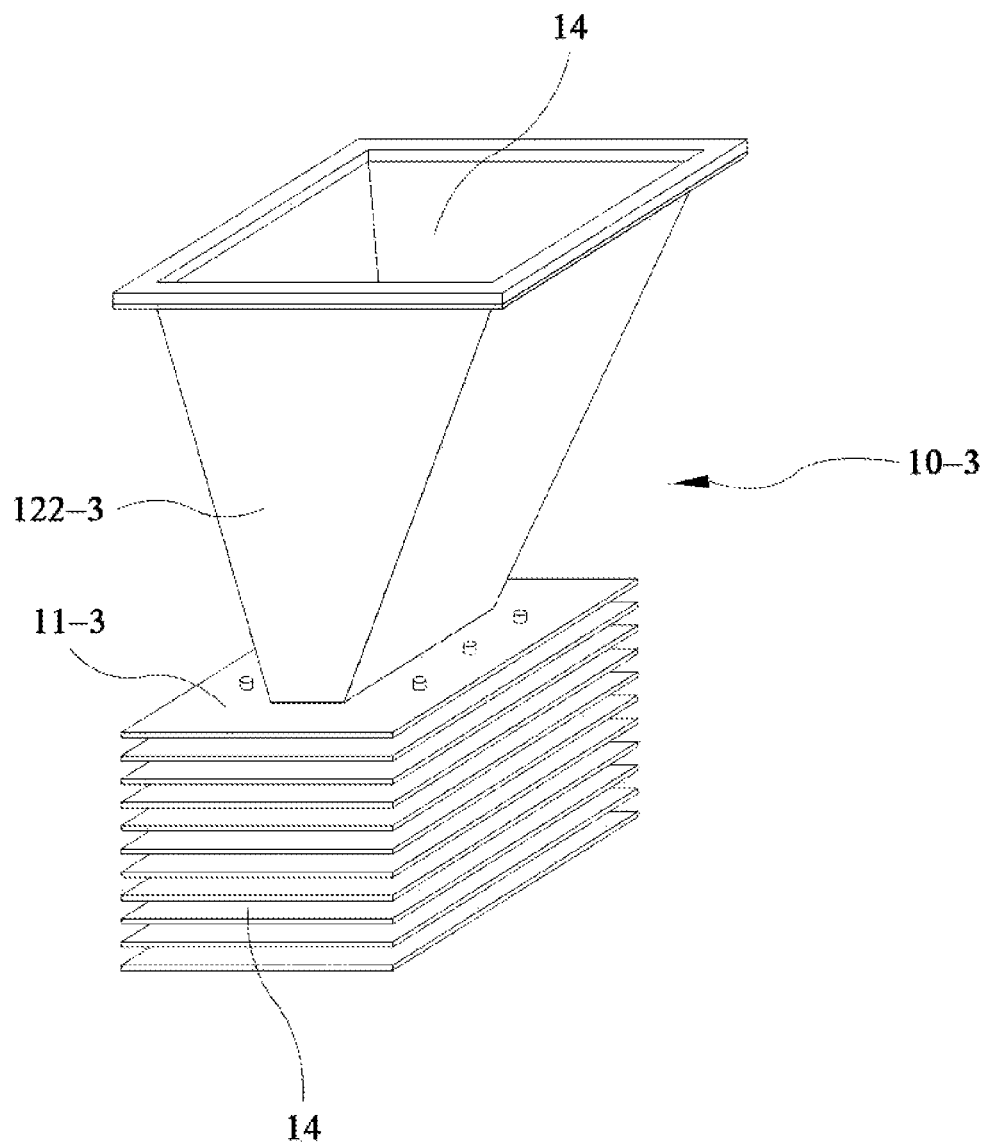
FIG. 9 is a combination view of the CPU fan-less cooling apparatus according to the fourth preferred embodiment of the present invention.

FIG. 9 is a combination view of the CPU fan-less cooling apparatus according to the fourth preferred embodiment. In FIG. 9, the air passage 14 of the CPU fan-less cooling apparatus 10-3 comprises the first air passage and the second air passage, the first air passage has a plurality of channels, the second air passage has one channel.

The locking apparatus used for fixing the CPU fan-less cooling apparatus is not shown in FIG. 8 and FIG. 9.

In the first preferred embodiment of the fan-less cooling apparatus, the graphic card fan-less cooling apparatus has three embodiments described below.

A first preferred embodiment of the graphic card fan-less cooling apparatus is described below.

Figure 10:
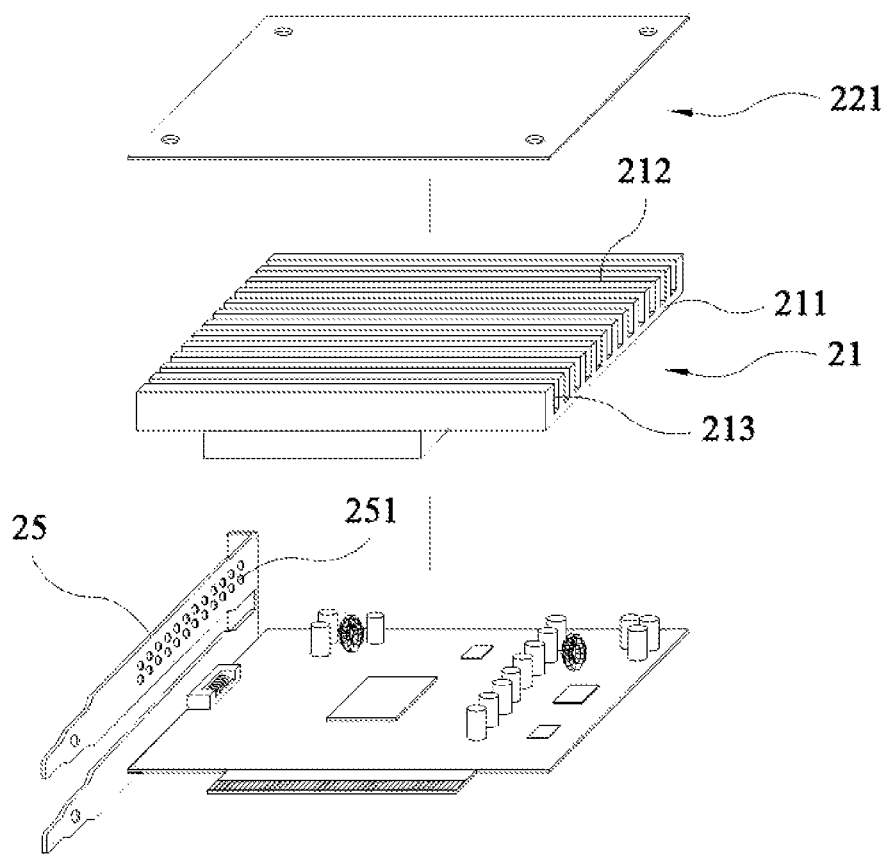
FIG. 10 is an exploded view of a graphic card fan-less cooling apparatus according to a first preferred embodiment of the present invention.

FIG. 10 is an exploded view of the graphic card fan-less cooling apparatus according to the first preferred embodiment. A card body of the graphic card and a baffle 25 of the graphic card fan-less cooling apparatus are shown in FIG. 10. In FIG. 8, the graphic card fan-less cooling apparatus comprises a radiator 21 and a coverplate 221. The radiator 21 is a heat dissipating part of the graphic card fan-less cooling apparatus. The radiator 21 comprises a base board 211 and a plurality of radiating fins 212 disposed on the base board 211, wherein, the coverplate 221 is disposed on the radiating fins 212 and is opposite to the base board 211, an air passage of the graphic card fan-less cooling apparatus has a plurality of channels, which is formed by the base board 211, the radiating fins 212, and the coverplate 221. The baffle 25 has a plurality of blowholes 251 thereon, wherein the blowholes 251 communicate with a plurality of grooves 213 between the radiating fins 212.

Figure 11:
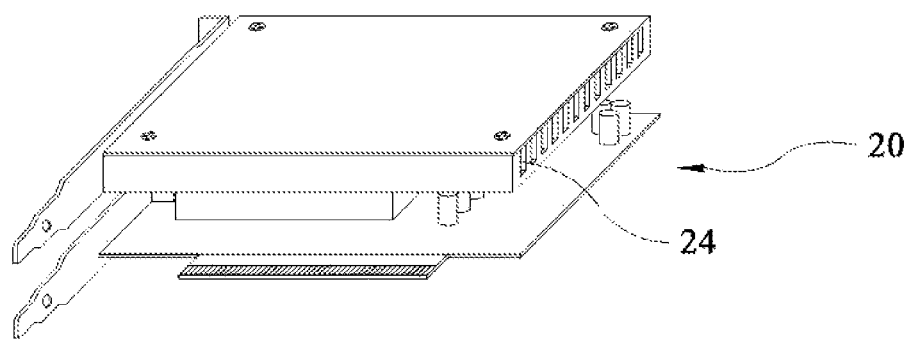
FIG. 11 is a combination view of the graphic card fan-less cooling apparatus according to the first preferred embodiment of the present invention.

FIG. 11 is a combination view of the graphic card fan-less cooling apparatus according to the first preferred embodiment. In FIG. 11, the radiating fins 212 are positioned between the channels of the air passage.

A second preferred embodiment of the graphic card fan-less cooling apparatus is described below.

Figure 12:
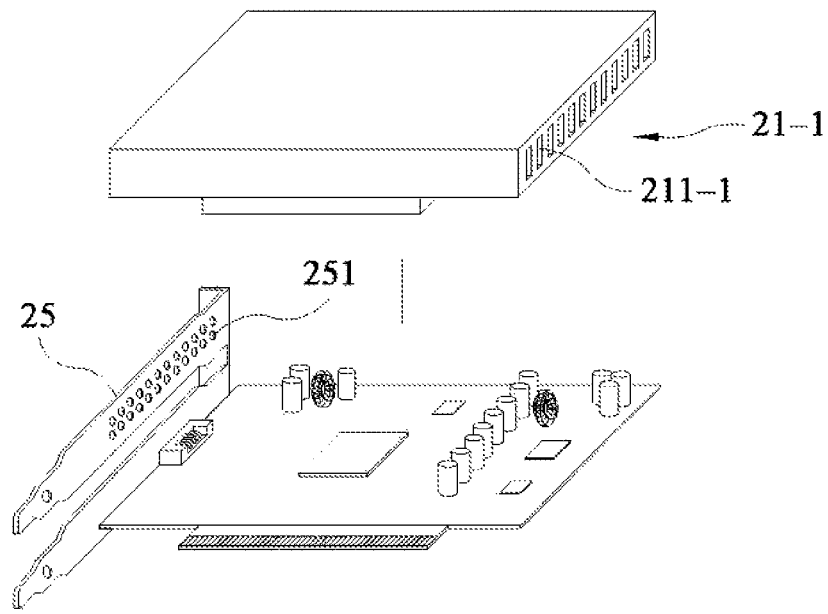
FIG. 12 is an exploded view of the graphic card fan-less cooling apparatus according to a second preferred embodiment of the present invention.

FIG. 12 is an exploded view of the graphic card fan-less cooling apparatus according to the second preferred embodiment. The following content only describes the different parts between the first preferred embodiment and the second preferred embodiment, the same or similar parts see the first preferred embodiment.

In FIG. 12, the graphic card fan-less cooling apparatus comprises a radiating board 21-1. The radiating board 21-1 is a heat dissipating part of the graphic card fan-less cooling apparatus. The radiating board 21-1 has a plurality of elongated pylomes 211-1 along the direction perpendicular to a baffle 25, the elongated pylomes 211-1 are an air passage of the graphic card fan-less cooling apparatus, the air passage communicates with a plurality of blowholes 251 of the baffle 25.

Figure 13:
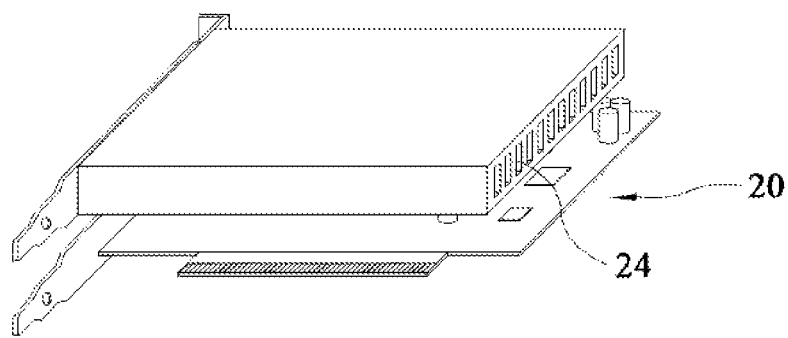
FIG. 13 is a combination view of the graphic card fan-less cooling apparatus according to the second preferred embodiment of the present invention.

FIG. 13 is a structure combination view of the graphic card fan-less cooling apparatus according to the first preferred embodiment. In FIG. 13, the air passage 24 of the graphic card fan-less cooling apparatus is the elongated pylomes 211-1 shown in FIG. 12.

A third preferred embodiment of the graphic card fan-less cooling apparatus is described below.

Figure 14:
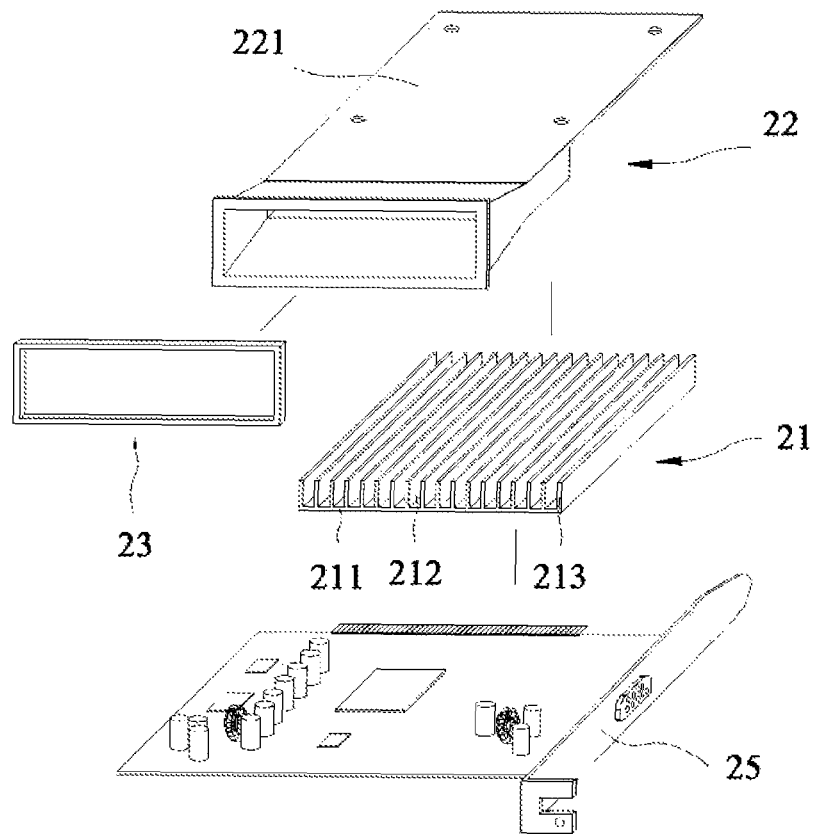
FIG. 14 is an exploded view of the graphic card fan-less cooling apparatus according to a third preferred embodiment of the present invention.

FIG. 14 is an exploded view of the graphic card fan-less cooling apparatus according to the third preferred embodiment. The following content only describes the different parts between the first preferred embodiment and the third embodiment, the same or similar parts see the first preferred embodiment.

In FIG. 14, the graphic card fan-less cooling apparatus comprises a radiator 21 and a wind pipe 22. The radiator 21 is a heat dissipating part of the graphic card fan-less cooling apparatus. The radiator 21 consists of a base board 211 and a plurality of radiating fins 212 disposed on the base board 211. A coverplate 221 extended from the edge of the wind pipe 22 and is disposed on the radiator 21. An air passage of the graphic card fan-less cooling apparatus comprises a first air passage and a second air passage, wherein, the first air passage is formed by the coverplate 221 and a plurality of grooves 213 between the radiating fins 212, the second air passage is formed by the wind pipe 22 with two open ends and a closed circumference. The coverplate 221 and the wind pipe 22 can be made respectively, wherein, the first air passage is built by the coverplate 221 and the radiator 21, the wind pipe 22 is disposed on one end of the first air passage to form the second air passage. The graphic card fan-less cooling apparatus is fixed on the graphic card with a manner that the radiating fins 212 is parallel to the baffle 25. A sponge 23 is affixed on the one end of the wind pipe 22 far from the coverplate 221, and contacts with an inner wall of the computer casing near the blowholes of the computer casing.

The sponge 23 and the sponge 13 have same alternative mode and function.

Figure 15:
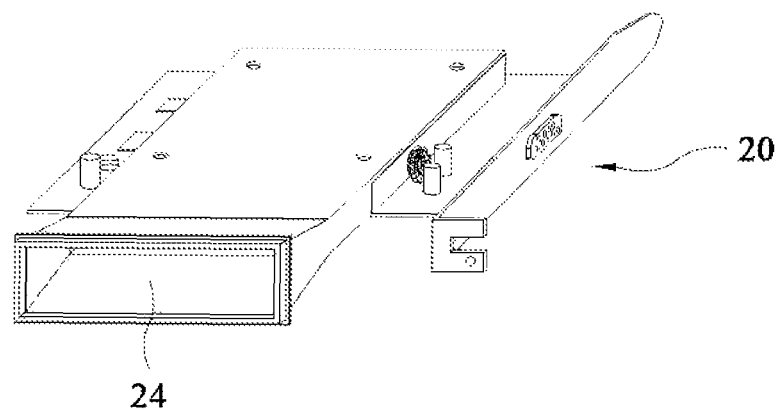
FIG. 15 is a combination view of the graphic card fan-less cooling apparatus according to the third preferred embodiment of the present invention.

FIG. 15 is a combination view of the graphic card fan-less cooling apparatus according to the third preferred embodiment. In FIG. 15, the air passage 24 of the graphic card fan-less cooling apparatus passes the radiator 21.

A preferred embodiment of the hard disk fan-less cooling apparatus is described below.

Figure 16:
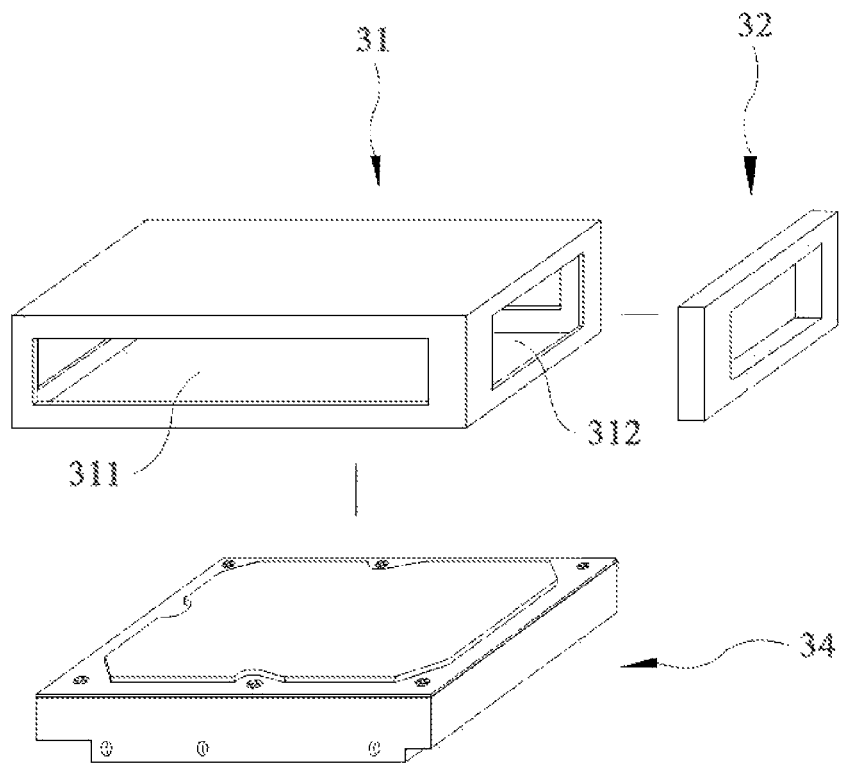
FIG. 16 is an exploded view of a hard disk fan-less cooling apparatus according to a preferred embodiment of the present invention.

FIG. 16 is an exploded view of the hard disk fan-less cooling apparatus according to the first preferred embodiment. A hard disk is also shown in FIG. 16, a shell of the hard disk is a heat dissipating part of both the hard disk and the hard disk fan-less cooling apparatus.

In FIG. 16, the hard disk fan-less cooling apparatus is a rectangular box 31. Two opposite sides of the rectangular box 31 respectively have a first mouth 311 having an approximative size with the hard disk, the hard disk inserts into the rectangular box 31 through the first mouth 311, the upper and lower edges of the first mouth 311 respectively contact with the upper and lower surfaces of the hard disk. the other two opposite sides of the rectangular box 31 respectively have a second mouth 312 having a height more than the thickness of the hard disk. The upper and lower surfaces of the rectangular box 31 have no mouth. An air passage of the hard disk fan-less cooling apparatus is formed by the upper and lower surfaces of the rectangular box 31 and the surfaces of the hard disk. A sponge 32 is affixed on one side of the rectangular box 31 having the second mouth 312. The sponge 32 is rectangular and contacts with an inner wall of the computer casing near the blowholes of the computer casing.

Figure 17:
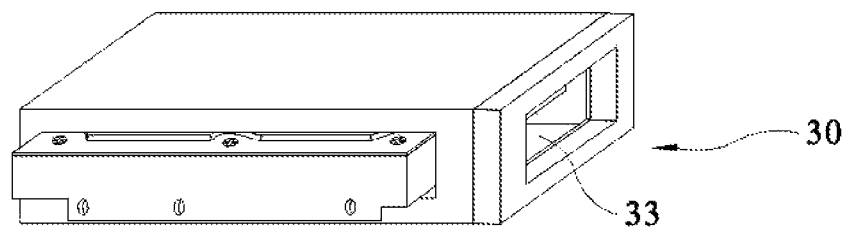
FIG. 17 is a combination view of the hard disk fan-less cooling apparatus according to the preferred embodiment of the present invention.

FIG. 17 is a combination view of the hard disk fan-less cooling apparatus according to the preferred embodiment. In FIG. 17, the air passage 33 of the hard disk fan-less cooling apparatus passes the upper and lower shells of the hard disk, and carries away the heat of the hard disk.

In a first preferred embodiment of the cooling system, the power supply fan-less cooling apparatus has two embodiments described below.

A first preferred embodiment of the power supply fan-less cooling apparatus is described below.

Figure 18:
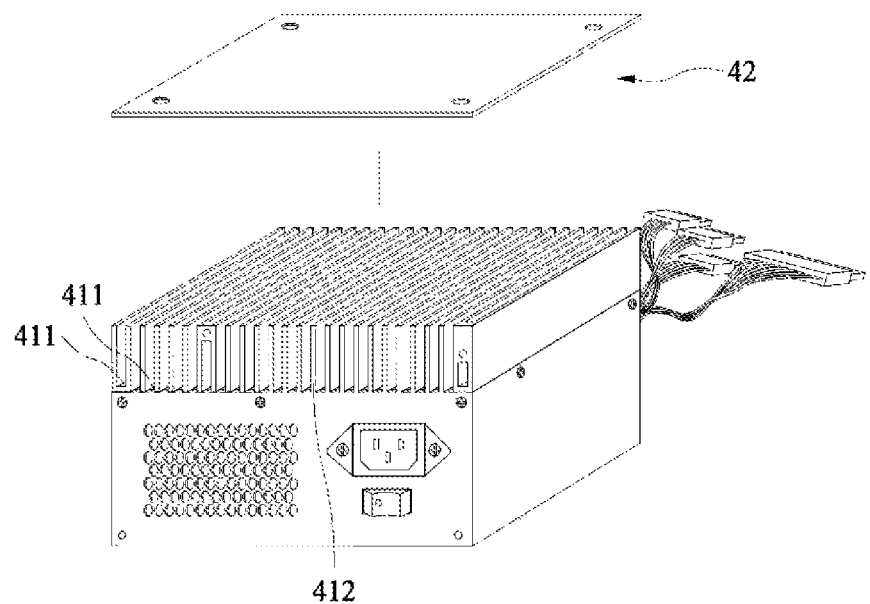
FIG. 18 is an exploded view of a power supply fan-less cooling apparatus according to a first preferred embodiment of the present invention.

FIG. 18 is an exploded view of the power supply fan-less cooling apparatus according to the first preferred embodiment. The whole power supply is shown in FIG. 18.

In FIG. 18, the power supply fan-less cooling apparatus comprises a base board 411, a plurality of radiating fins 412 and a coverplate 42, wherein the base board 411 is a shell of the power supply. A radiator consisting of the base board 411 and the radiating fins 412 is a heat dissipating part of the power supply fan-less cooling apparatus. The coverplate 42 is disposed on the radiating fins 412 and is opposite to the base board 411. An air passage has a plurality of channels, which is formed by the base board 411, the radiating fins 412 and the coverplate 42.

Figure 19:
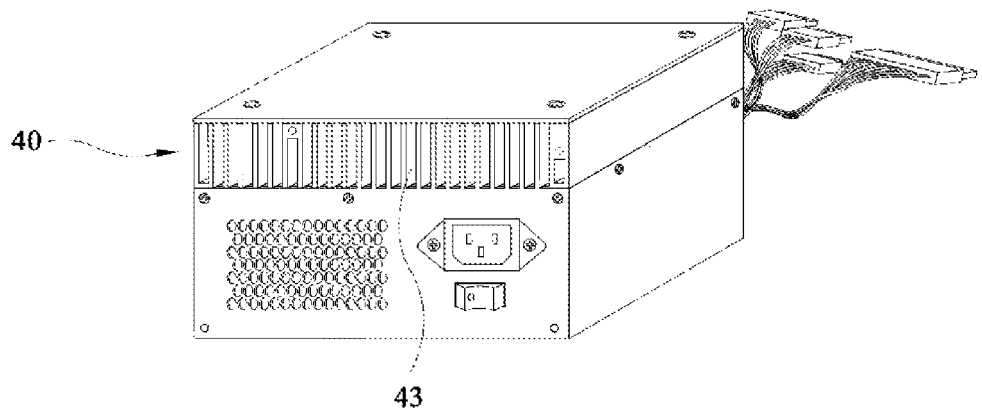
FIG. 19 is a combination view of the power supply fan-less cooling apparatus according to the first preferred embodiment of the present invention.

FIG. 19 is a combination view of the power supply fan-less cooling apparatus according to the first preferred embodiment. In FIG. 19, the radiating fins 412 are positioned between the channels of the air passage 43, therefore, the air passage 43 passes the heat dissipating part of the power supply fan-less cooling apparatus 40. One end of the air passage 43 communicates with the exterior of the computer casing through the blowholes of the computer casing.

A second preferred embodiment of the power supply fan-less cooling apparatus is described below.

The difference between the first preferred embodiment and the second preferred embodiment is described below. In the first preferred embodiment, a radiator of the power supply fan-less cooling apparatus is disposed on an outer wall of a shell of the power supply, the shell of the power supply is a base board of the radiator, an air passage has a plurality of channels, which is formed by the radiator and a coverplate. In second preferred embodiment, the radiator is disposed on the inner wall of the shell of the power supply, a plurality of radiating fins of the radiator are disposed on the base board, the base board is opposite to the shell of the power supply and is the shield of the power supply fan-less cooling apparatus, the air passage has a plurality of channels, which is formed by the radiator and the shell of the power supply.

Figure 20:
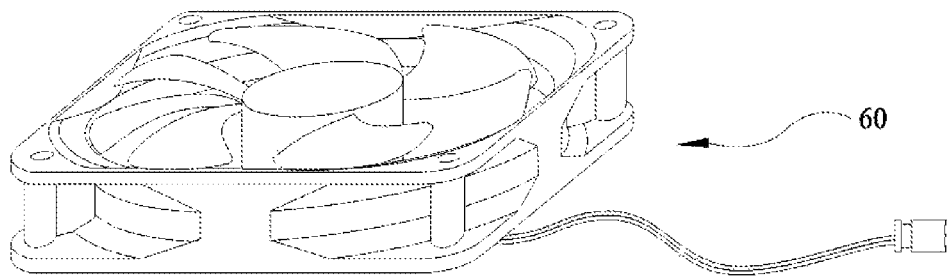
FIG. 20 is a perspective view of a fan of the cooling system for computer according to a first preferred embodiment of the present invention.

FIG. 20 is a perspective view of the fan according to the first preferred embodiment of the cooling system. In FIG. 20, the radiating fan 60 is no less than 80 mm in diameter. In this embodiment, the radiating fan 60 is 120 mm in diameter. The radiating fan 60 is mounted on the blowholes used for the radiating fan through a damping device or a wind pipe, or the radiating fan 60 is directly mounted on the blowholes used for the radiating fan. A number of the radiating fan 60 can be one or more. In this embodiment, the number of the radiating fan 60 is one.

Figure 21:
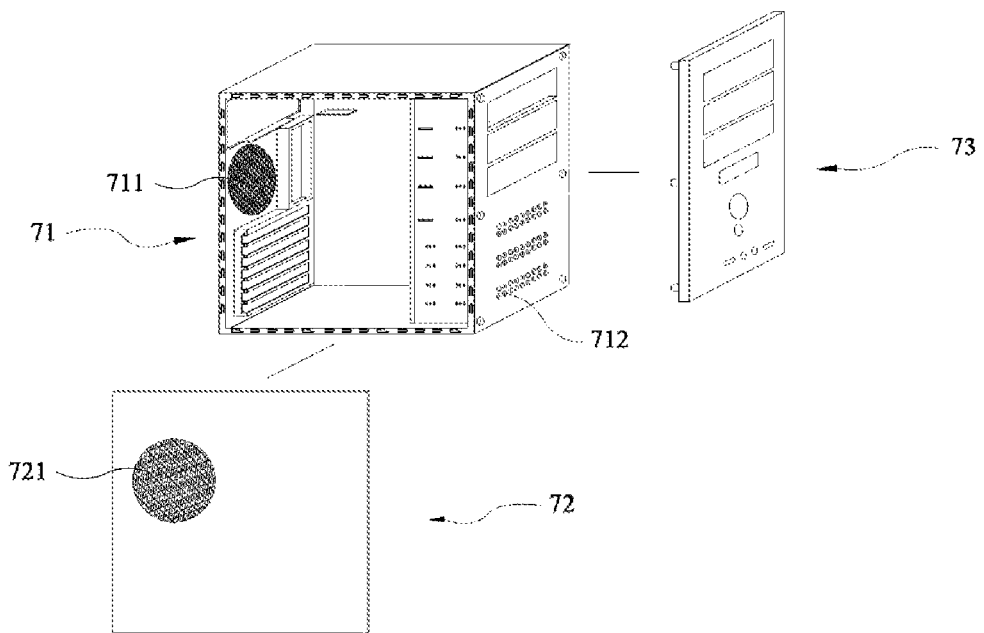
FIG. 21 is an exploded view of a computer casing of the cooling system for computer according to a first preferred embodiment of the present invention.

FIG. 21 is an exploded view of the computer casing according to the first preferred embodiment of the cooling system.

In FIG. 21, the computer casing is a vertical, and comprises a casing body 71, a left coverplate 72, a right coverplate and a front coverplate 73, wherein the right coverplate is not shown in drawing. A back faceplate of the casing body has a plurality of blowholes 711 thereon for the fan, a front faceplate of the casing body has a plurality of blowholes 712 thereon for the hard disk fan-less cooling apparatus. The front coverplate 73 has a vent on bottom, the vent is not shown in drawing. The airflow passes the blowholes 712 used for the hard disk fan-less cooling apparatus from the vent. The left coverplate 72 has a plurality of blowholes 721 thereon for the CPU fan-less cooling apparatus. The computer casing has special mounting position and blowholes for the graphic card and the power supply, the graphic card and the power supply respectively have at least one surface to contact with air outside the computer casing, therefore, there are no special blowholes on the computer casing for both the graphic card fan-less cooling apparatus and the power supply fan-less cooling apparatus.

Further, two supporters are respectively disposed on a position of the computer casing corresponding to center areas of the left coverplate 72 and the right coverplate, the center areas of the left coverplate 72 and the right coverplate are respectively fixed on the supporters. the left coverplate 72 and the right coverplate respectively have a big area and a thin thickness, there is easy to cause resonance and make an abuzz sound if circumferential edges of the left coverplate 72 and the right coverplate are respectively fixed on the computer casing, the center areas of the coverplate 72 and the right coverplate are fixed by the supporters so as to obviously reduce the noise caused by the resonance.

Figure 22:
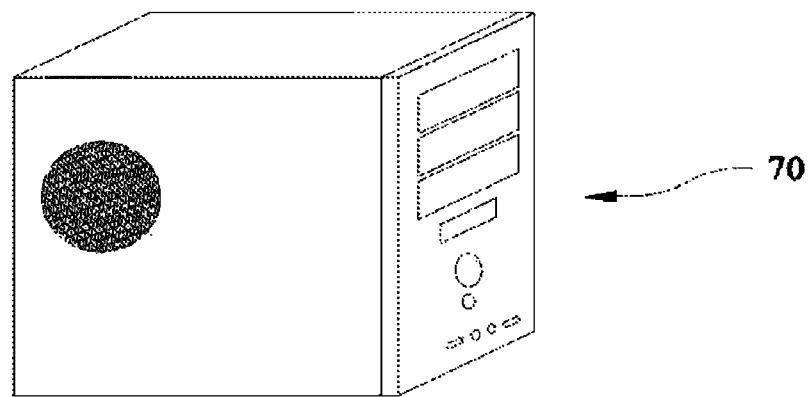
FIG. 22 is a combination view of the computer casing of the cooling system for computer according to the first preferred embodiment of the present invention.

FIG. 22 is a combination view of the computer casing according to the first preferred embodiment of the cooling system. The computer casing 70 is shown in FIG. 22.

Figure 23:
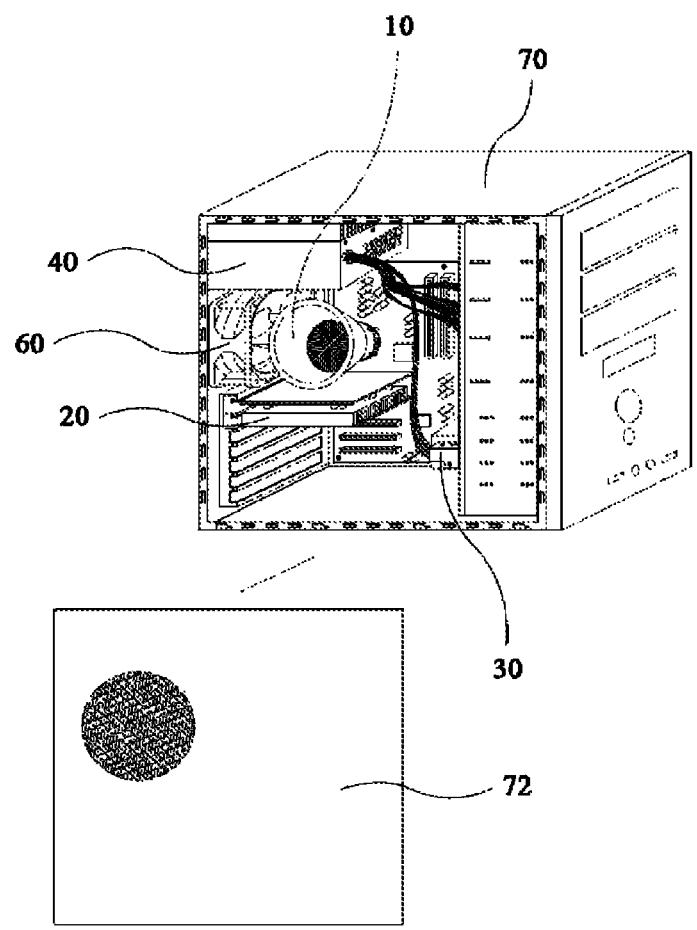
FIG. 23 is an assembly view of a cooling system for computer according to a first preferred embodiment of the present invention.

FIG. 23 is an assembly view of the cooling system according to the first preferred embodiment. The mounting process of the cooling system and the mounting process of the ordinary computer have no difference. First, each fan-less cooling apparatus is mounted on the corresponding electronic component which need cooling, the fan-less cooling apparatuses comprises the CPU fan-less cooling apparatus 10, the graphic card fan-less cooling apparatus 20, the hard disk fan-less cooling apparatus 30 and the power supply fan-less cooling apparatus 40. Second, the mainboard, the graphic card, the hard disk, the power supply and the radiating fan 60 are respectively fixed on the corresponding position of the computer casing 70, when the radiating fan 60 is mounted, the radiating fan 60 blows air inside, or the radiating fan 60 blows air outside. Third, the computer is closed. It is worth to mention that the radiator is firstly fixed on the CPU when the CPU fan-less cooling apparatus is mounted, then the wind pipe is mounted on the radiator before the left coverplate 72 is mounted.

Figure 24:
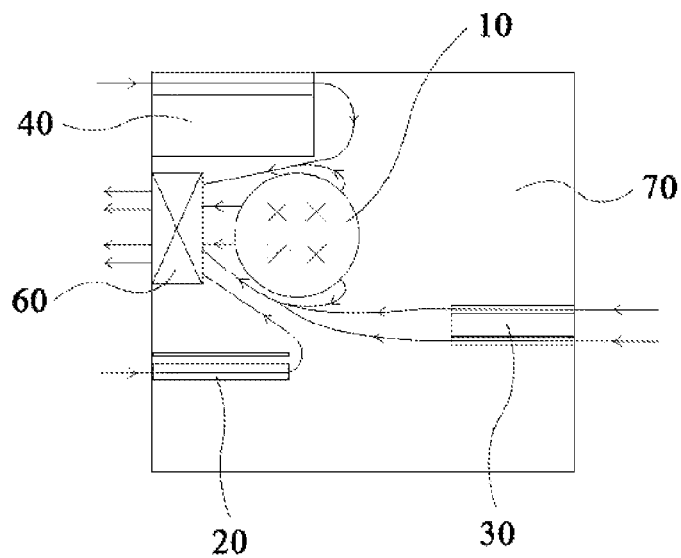
FIG. 24 is a tendency chart of the airflow of the cooling system for computer when a radiating fan blows air outside according to the first preferred embodiment of the present invention.

FIG. 24 is a tendency chart of the airflow when the radiating fan 60 blows air outside according to the first preferred embodiment of the cooling system. FIG. 24 is a projection drawing seen from the front of the left coverplate. In FIG. 24, the CPU fan-less cooling apparatus 10, the graphic card fan-less cooling apparatus 20, the hard disk fan-less cooling apparatus 30, the power supply fan-less cooling apparatus 40 and the fin 60 are respectively mounted on the corresponding position of the computer casing 70, and the radiating fan 60 blows air outside. The arrowheads show the direction of the airflow, the cross in the CPU fan-less cooling apparatus shows that the airflow inpours into the CPU fan-less cooling apparatus from the exterior of the computer casing.

Figure 25:
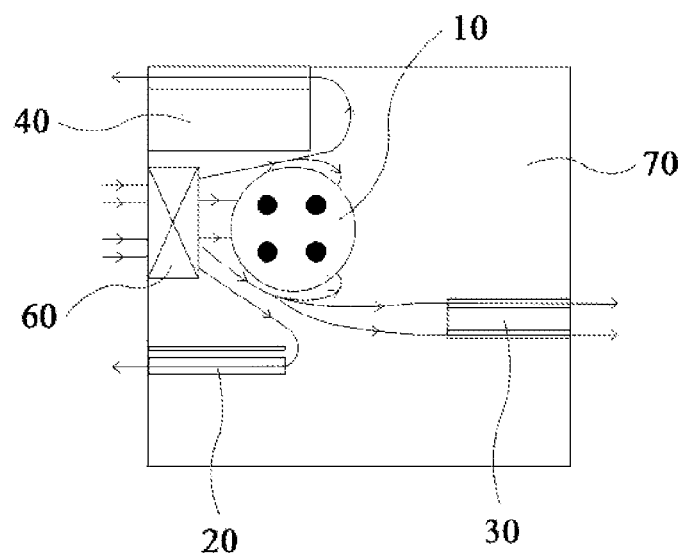
FIG. 25 is a tendency chart of the airflow of the cooling system for computer when the radiating fan blows air inside according to the first preferred embodiment of the present invention.

FIG. 25 is a tendency chart of the airflow when the radiating fan 60 blows air inside according to the first preferred embodiment of the cooling system. The difference between FIG. 24 and FIG. 25 is that the radiating fan 60 blows air inside. In FIG. 25, the black dot in the CPU fan-less cooling apparatus shows that the airflow outpours out of the computer casing through the CPU fan-less cooling apparatus. The other parts in FIG. 25 have same structure and same mounting position with the corresponding parts in FIG. 24.

As shown in FIG. 24 and FIG. 25, the operating principle of the fan-less cooling apparatus is described below. In the cooling system, the fan-less cooling apparatuses, such as the CPU fan-less cooling apparatus 10, the graphic card fan-less cooling apparatus 20, the hard disk fan-less cooling apparatus 30 and the power supply fan-less cooling apparatus 40, respectively have the air passage which traverses the heat dissipating part, the computer casing has the blowholes used for the air passage thereon corresponding to the respective air passage. One end of the air passage communicates with the air outside the computer casing 70, the other end of the air passage communicates with the air inside the computer casing 70. The radiating fan 60 blows air outside or inside so as to cause an air pressure difference between the interior and the exterior of the computer casing. When the radiating fan 60 blows air outside, the air pressure inside the computer casing is lower than the air pressure outside the computer casing, the air outside the computer casing inpours into the air passage through the blowholes used for the air passage, outpours out of the computer casing 70 through the blowholes used for the radiating fan 60, and carries away the heat of the heat dissipating parts, wherein the heat dissipating parts respectively absorb the heat of the CPU, the GPU, the power electronic component of the power supply and the hard disk. When the radiating fan 60 blows air inside, the air pressure inside the computer casing is higher than the air pressure outside the computer casing, the air outside the computer casing inpours into the computer casing through the radiating fan, respectively passes each air passage, outpours out of the computer casing 70 through the blowholes used for the air passage, and carries away the heat of the heat dissipating parts, wherein the heat dissipating parts respectively absorb the heat of the CPU, the GPU, the power electronic component of the power supply and the hard disk.

As shown in FIG. 24 and FIG. 25, the airflow caused by the radiating fan 60 almost passes each heat dissipating part of the fan-less cooling apparatus, and comes from the low-temperature air outside the computer casing. Therefore, the fan-less cooling apparatus have a better heat dissipating effect, a low-speed large-diameter fan is chosen as the radiating fan 60 so as to dissipate heat better and reduce the noise.

In the cooling system, the radiator of the CPU fan-less cooling apparatus can be very high, don't worry that the bottom of the radiator can not dissipate heat well, because the shield and the wind pipe respectively have a corresponding shape, the air pressure difference between the interior and the exterior of the computer casing makes the airflow pass the bottom of the radiator, it is different with the mode that an high-speed fan of the ordinary fan cooling apparatus makes airflow pass the bottom of the radiator.

The air quantity and air pressure of the fan are two relative concepts, much air quantity can carry away more heat, high air pressure can carry air to far place. Generally, the large-diameter fan causes much air quantity, the high-speed fan causes a high air pressure. In the present invention, the air pressure difference between the interior and the exterior of the computer casing lies on the air quantity of the radiating fan, therefore, the low-speed large-diameter fan is possibly chosen so as to dissipate heat better and reduce the noise. And, the radiating fan can be mounted on any unused position of the computer casing, it is necessary to make the radiating fan mount near the fan-less cooling apparatus, the radiating fan can be directly mounted on the blowholes of the computer casing, or the radiating fan can be mounted on the blowholes of the computer casing through the damping device or the wind pipe (not shown in drawing). If the computer parts are mounted within an existing vertical ATX computer casing, the maximal radiating fan mounted on the back faceplate of the ATX casing body is a 120 mm in diameter, the maximal radiating fan mounted on the top of the ATX casing body is a 160 mm in diameter. The radiating fan with a diameter of 120 mm has a low noise under 1500 rpm.

In the cooling system, the plug of the radiating fan 60 inserts into the fan socket of the mainboard, such that the operation condition of the radiating fan 60 can be monitored by a fan monitor of the mainboard, the fan monitor will warn or close the computer when the radiating fan 60 is damaged. Further, the radiating fan 60 comprises a speeder, wherein the speeder comprises a circuit, an output voltage of the circuit can be adjusted, changing the service voltage of the radiating fan 60 can adjust the rotating speed of the radiating fan 60 to adjust the air quantity of the airflow so as to adjust the air pressure between the interior and the exterior of the computer casing, such that the computer can adapt to different using circumstance.

In the cooling system, except the blowholes used for the air passage and the blowholes used for the radiating fan, the computer casing has few else blowholes thereon, the else blowholes is far from the radiating fan or is opposite to the radiating fan so as to make the airflow pass the whole computer casing. The else blowholes is used for else heat dissipating parts of the computer, but the else blowholes reduces the air quantity of the airflow passing the fan-less cooling apparatuses, therefore, a number of the else blowholes is few and is according to the number of the radiating fan, the air quantity and the computer configuration.

In the cooling system, a movable or rotatable faceplate is disposed on the front coverplate of the computer casing. The blowholes formed on the faceplate and the blowholes formed on the coverplate have corresponding position and same number. The blowholes of the faceplate and the blowholes of the front coverplate stagger each other with a certain position according to adjusting the relative position between the faceplate and the front coverplate in order to adjust the air quantity. The adjustable ventilation apparatus is also used for the heat dissipating effect of the else heat dissipating parts.

The experiment has proved above projects. In the experiment, the CPU fan-less cooling apparatus is two X-shaped radial radiators of the CPU cooling apparatus having fan, two radiators are assembled together through the screw arbor, a heat-conducting silicon grease is smeared between the contacting surfaces of the radiators. The fan-less power supply is refitted with an existing 300 W power supply having fan according to the Patent Application CN 200710107330. The radiating fan is an existing low-speed rotation-adjusting fan with a diameter of 120 mm, the noise is 15~25 db when the rotation speed is 1200 rpm~2200 rpm. The computer casing is an existing ordinary computer casing, except the necessary blowholes, the others is blocked by the adhesive tape, the blowholes of the left coverplate positioned upon the CPU is added. The CPU is Pentium D 820, the TDP of the CPU is 95

W. The mainboard is ASUS P5PL2. The graphic card is ASUS EAX1300PRO SILENT. The hard disk is ST3160812 160 G, and has no assistant cooling apparatus. The memory is 2×512M Kingston DDR2 533. The ambient temperature is 28° C., the rotation speed of the radiating fan is 1500 rpm, the occupating coefficient of the CPU is under 5%, when the radiating fan 60 blows air outside, the CPU temperature is about 55° C., the mainboard temperature is 41° C., the hard disk temperature is 44° C., the fan-less power supply temperature is about 40° C.; when the radiating fan 60 blows air inside, the CPU temperature is about 59° C., the mainboard temperature is 43° C., the hard disk temperature is 46° C., the fan-less power supply temperature is about 43° C.

As shown in above experiment, in two modes that the radiating fan causes the air pressure, the heat dissipating effect with blowing air outside is better than the heat dissipating effect with blowing air inside because the airflow with the effect of the negative pressure firstly passes the higher-temperature fan-less cooling apparatus in the computer casing, the airflow with the effect of the positive pressure firstly passes the mainboard, the airflow temperature has been high when the airflow passes the fan-less cooling apparatus. But whether the radiating fan blows air outside, or the radiating fan blows air inside, the heat dissipating effect of the cooling system meets operating requirement, and the noise of the cooling system is reduced obviously.

A second preferred embodiment of the cooling system is described below.

Compare the first preferred embodiment of the cooling system with the second preferred embodiment of the cooling system, the difference is described below. In the second preferred embodiment of the cooling system, the power supply having fan replaces the fan-less power supply, and cancels the special radiating fan and the special blowholes used for the special radiating fan. The following content only describes the different parts between the first preferred embodiment and the second preferred embodiment, the same or similar parts see the first preferred embodiment.

The second preferred embodiment of the cooling system comprises a CPU fan-less cooling apparatus, a graphic card fan-less cooling apparatus, a hard disk fan-less cooling apparatus, a power supply having fan and a computer casing.

In the second preferred embodiment of the cooling system, the CPU fan-less cooling apparatus, a graphic card fan-less cooling apparatus, a hard disk fan-less cooling apparatus respectively have same structure and same mounting position with the first preferred embodiment.

Figure 26:
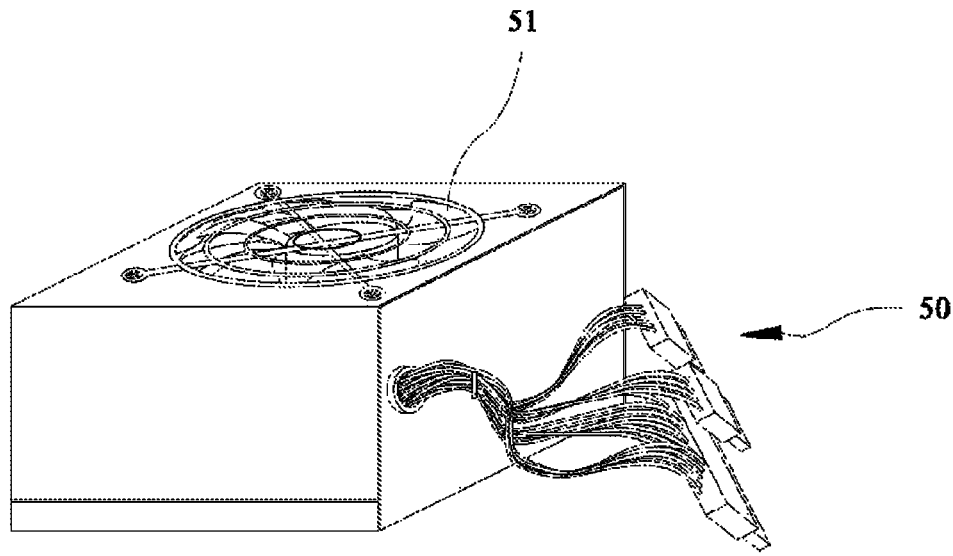
FIG. 26 is a perspective view of a power supply having fan of the cooling system for computer according to a second preferred embodiment of the present invention.

FIG. 26 is a perspective view of the power supply having fan according to the second preferred embodiment of the cooling system. In FIG. 26, a radiating fan 51 is positioned on the top of the power supply having fan 50. The fan 51 is a low-speed large-diameter silent fan. When the power supply having fan is mounted, one surface of the power supply having fan 50 which has the fan 51 is down, the fan 51 blows air outside, or the fan 51 blows air inside.

Figure 27:
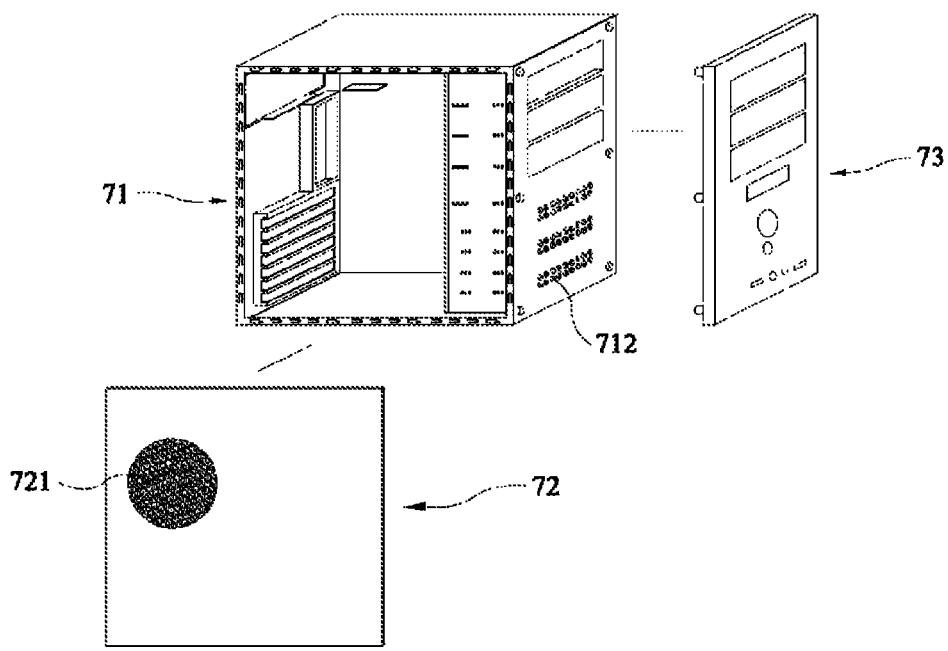
FIG. 27 is an exploded view of the computer casing of the cooling system for computer according to a second preferred embodiment of the present invention.

FIG. 27 is an exploded view of the computer casing according to the second preferred embodiment of the cooling system. Compare the computer casing shown in FIG. 27 with the computer casing shown in FIG. 21, the difference is that the former cancels the blowholes used for the special radiating fan of the latter.

Figure 28:
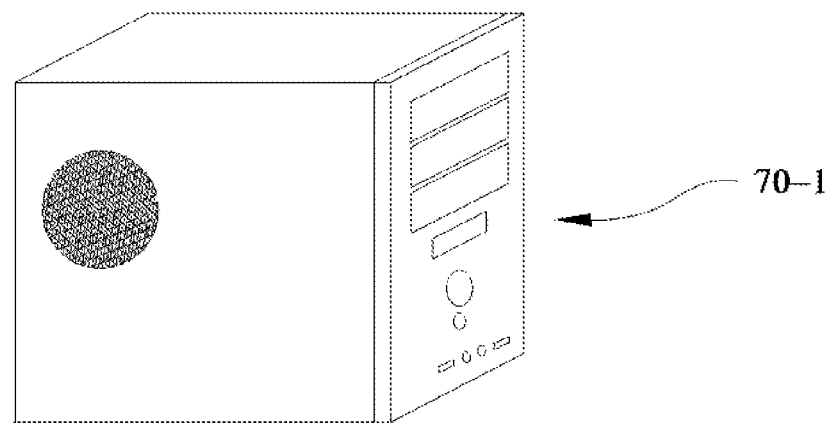
FIG. 28 is a combination view of the computer casing of the cooling system for computer according to the second preferred embodiment of the present invention.

FIG. 28 is a combination view of the computer casing according to the second preferred embodiment of the cooling system. The computer casing 70-1 shown in FIG. 28 has been assembled.

Figure 29:
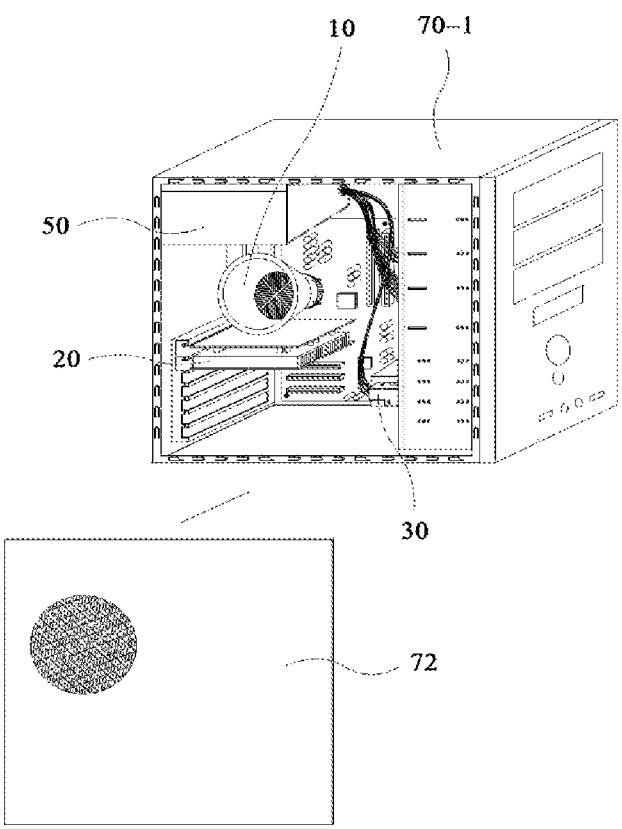
FIG. 29 is an assembly view of the cooling system for computer according to a second preferred embodiment of the present invention.

FIG. 29 is an assembly view of the cooling system according to the second preferred embodiment. In FIG. 29, the CPU fan-less cooling apparatus 10, the graphic card fan-less cooling apparatus 20, the hard disk fan-less cooling apparatus 30 and the power supply having fan 50 are respectively mounted on the corresponding position. a plurality of blowholes used for the CPU fan-less cooling apparatus 10 is formed on a left coverplate 72 of the computer casing 70-1.

Figure 30:
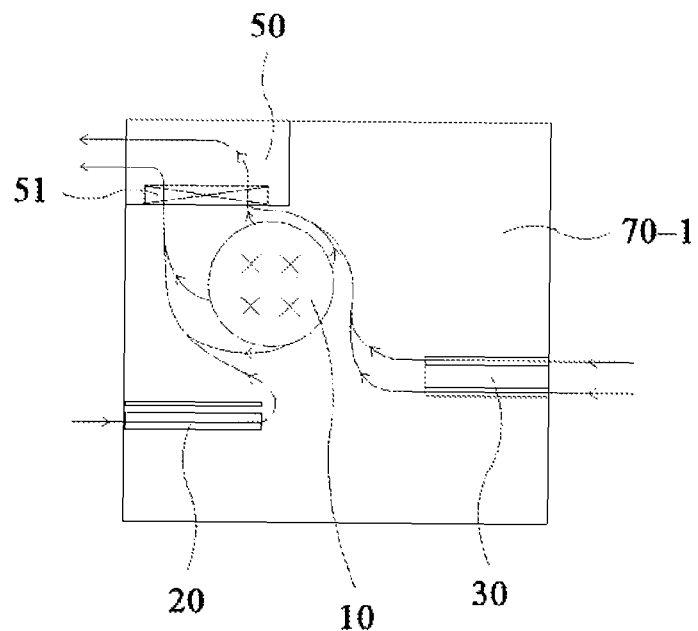
FIG. 30 is a tendency chart of the airflow of the cooling system for computer when the fan blows air outside according to the second preferred embodiment of the present invention.

FIG. 30 is a tendency chart of the airflow when the fan blows air outside according to the second preferred embodiment of the cooling system. In FIG. 30, the arrowheads show the direction of the airflow, the cross in the CPU fan-less cooling apparatus shows that the airflow inpours into the CPU fan-less cooling apparatus 10 from the exterior of the computer casing. The fan 51 of the power supply having fan 50 blows air outside so as to cause an air pressure between the interior and the exterior of the computer casing 70-1. Under the effect of the air pressure, the air outside the computer casing 70-1 inpours into the computer casing 70-1 through the blowholes used for the CPU fan-less cooling apparatus, the blowholes used for the graphic card fan-less cooling apparatus, the blowholes used for the hard disk fan-less cooling apparatus. If the arrowheads of the airflow shown in FIG. 30 are reversed, FIG. 30 is a tendency chart of the airflow when the fan blows air inside according to the second preferred embodiment of the cooling system.

The second preferred embodiment of the cooling system and the first preferred embodiment of the cooling system have an approximative operating principle, the difference is described below. In the second preferred embodiment, the air pressure between the interior and the exterior of the computer casing is caused by the fan 51 of the power supply having fan 50 blowing air outside or inside.

The experiment has proved above projects. The experiment condition of the second preferred embodiment and the experiment condition of the first preferred embodiment are almost same, the difference is that the power supply is an existing 230 W power supply having fan, wherein the fan is 120 mm in diameter, the rotation speed is unknown, the fan is quiet in experiment, the blowholes used for the special radiating fan of the first preferred embodiment is blocked by the adhesive tape. The ambient temperature is 28° C., the rotation speed of the fan is 1500 rpm, the computer is free, the occupating coefficient of the CPU is low, when the fan 51 of the power supply having fan 50 blows air outside, the CPU temperature is about 59° C., the mainboard temperature is 42° C., the hard disk temperature is 45° C., the temperature of the power supply having fan is about 55° C.; when the fan 51 of the power supply having fan 50 blows air inside, the CPU temperature is about 69° C., the mainboard temperature is 44° C., the hard disk temperature is 47° C., the temperature of the power supply having fan is about 40° C. The heat dissipating effect meets operation requirement and the noise of the cooling system is reduced obviously.

According to the second preferred embodiment of the cooling system, in two modes that the fan causes the air pressure, both the heat dissipating effect with blowing air outside and the heat dissipating effect with blowing air inside are worse than the first preferred embodiment, especially, the latter is worst, the latter is general used for the low-configuration computer. The reason is that the airflow passes two fan-less cooling apparatuses in turn in the second preferred embodiment, it is obviously bad for latter fan-less cooling apparatus, especially, when the airflow inpours into the higher-temperature cooling apparatus from the lower-temperature cooling apparatus.

A third preferred embodiment of the cooling system is described below.

Compare the first preferred embodiment of the cooling system with the third preferred embodiment of the cooling system, the difference is described below. In the third preferred embodiment of the cooling system, the power supply having fan replaces the fan-less power supply of the first preferred embodiment. The following content only describes the different parts between the first preferred embodiment and the third preferred embodiment, the same or similar parts see the first preferred embodiment.

The third preferred embodiment of the cooling system comprises a CPU fan-less cooling apparatus, a graphic card fan-less cooling apparatus, a hard disk fan-less cooling apparatus, a special radiating fan, a power supply having fan and a computer casing.

In the third preferred embodiment of the cooling system, the CPU fan-less cooling apparatus, the graphic card fan-less cooling apparatus, the hard disk fan-less cooling apparatus, the special radiating fan and the computer casing respectively have same structure and same mounting position with the first preferred embodiment.

In the third preferred embodiment of the cooling system, the power supply having fan has same structure and same mounting mode with the second preferred embodiment.

Figure 31:
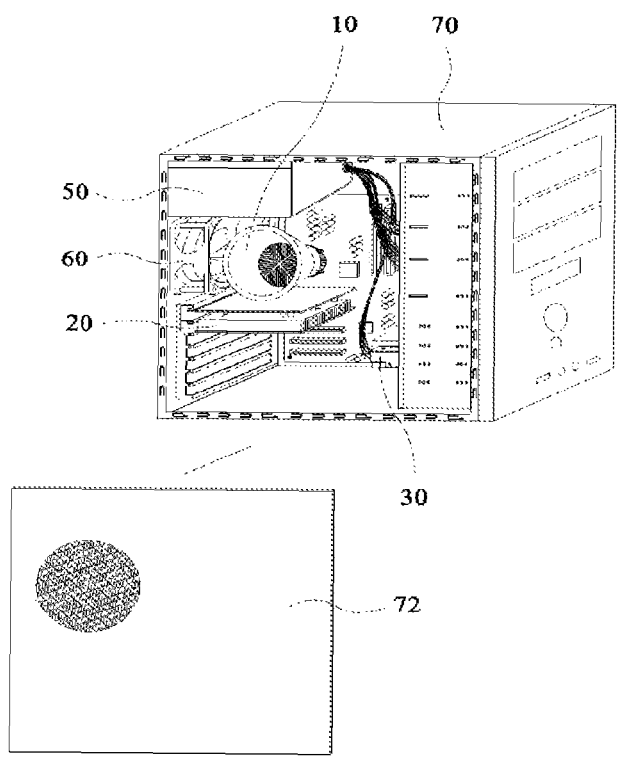
FIG. 31 is an assembly view of the cooling system for computer according to a third preferred embodiment of the present invention.
Figure 32:
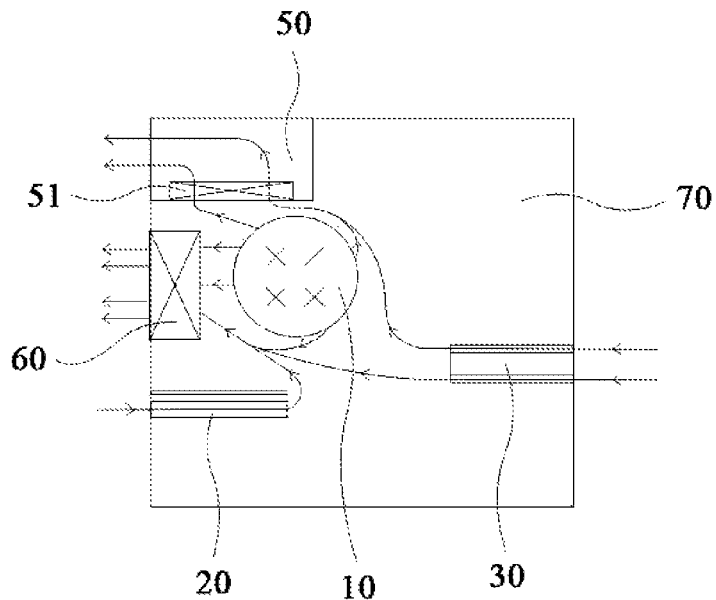
FIG. 32 is a tendency chart of the airflow of the cooling system for computer when the fan blows air outside according to the third preferred embodiment of the present invention.

FIG. 31 is an assembly view of the cooling system according to the third preferred embodiment. The difference of the assembly view between FIG. 31 and FIG. 32 is described below. The power supply having fan 50 replaces the fan-less power supply, wherein the power supply fan-less cooling apparatus 40 is disposed on the fan-less power supply. The fan of the power supply having fan 50 and the special radiating fan uniformly blow air outside or inside. A number of the special radiating fan 60 can be one or more. When the special radiating fan 60 is a plurality of, the mounting position and mounting method of the special radiating fan 60 refer to the corresponding description of the first embodiment, the position change of the blowholes of the computer casing caused by the mounting position and mounting method of the special radiating fan 60 also refer to the corresponding description of the first embodiment. In this embodiment, the number of the special radiating fan is one.

FIG. 32 is a tendency chart of the airflow when the fan blows air outside according to the third preferred embodiment of the cooling system. In FIG. 32, the arrowheads show the direction of the airflow, the cross in the CPU fan-less cooling apparatus shows that the airflow inpours into the CPU fan-less cooling apparatus 10 from the exterior of the computer casing. If the arrowheads of the airflow shown in FIG. 32 are reversed, FIG. 32 is a tendency chart of the airflow when the fan blows air inside according to the third preferred embodiment of the cooling system.

The third preferred embodiment of the cooling system and the first preferred embodiment of the cooling system have an approximative operating principle, the difference is described below. In the third preferred embodiment, the air pressure between the interior and the exterior of the computer casing is caused by the fan 51 of the power supply having fan 50 and the special radiating fan 60 uniformly blowing air outside or inside.

The experiment has proved above projects. The experiment condition of the second preferred embodiment and the experiment condition of the first preferred embodiment are almost same, the difference is that the power supply is an existing 230 W power supply having fan, the 230 W power supply having fan of the third embodiments is same with the 230 W power supply having fan of the second embodiment. The ambient temperature is 28° C., the rotation speed of the fans is 1500 rpm, the computer is free, the occupating coefficient of the CPU is low, when the fan 51 of the power supply having fan 50 and the special radiating fan uniformly blow air outside, the CPU temperature is about 50° C., the mainboard temperature is 33° C., the hard disk temperature is 35° C., the temperature of the power supply having fan is about 48° C.; when the fan 51 of the power supply having fan 50 and the special radiating fan uniformly blow air inside, the CPU temperature is about 56° C., the mainboard temperature is 41° C., the hard disk temperature is 43° C., the temperature of the power supply having fan is about 40° C. The heat dissipating effect is better, and compare with both the first embodiment and the second embodiment, the noise of the third embodiment does not increase obviously because the fan of the power supply having fan and the special radiating fan are low-speed large-diameter silent fans.

According to the third preferred embodiment of the cooling system, in two modes that the fans causes the air pressure, although the problem that the airflow passes two fan-less cooling apparatuses in turn is existent to a certain extent, the mode that two fans blow air outside to cause a negative pressure gets a better heat dissipating effect, but the mode that two fans blow air outside to cause a positive pressure only gets an approximative heat dissipating effect with the first preferred embodiment which uses one fan to blow air outside.

According to the present invention, a cooling method for computer is described below.

Figure 33:
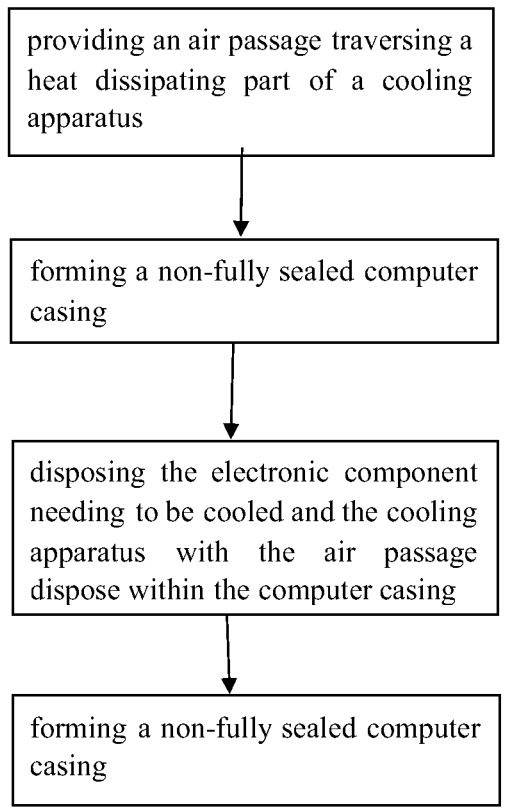
FIG. 33 is a flow chart of a cooling method according to a preferred embodiment of the present invention.

FIG. 33 is a flow chart of the cooling method according to the preferred embodiment.

As shown in FIG. 33, the cooling method comprises the steps of:

step 3301: providing an air passage traversing a heat dissipating part of a cooling apparatus, wherein the air passage has two open ends and a closed circumference; the heat dissipating part is generally made of material with good heat dissipating performance, such as radiator; the heat dissipating part also can be a shell of a dissipating object; except the heat dissipating part, the cooling apparatus can further comprise a wind pipe, wherein the wind pipe leads air outside a computer casing into the air passage, or leads air inside the air passage out of the computer casing;

step 3302: forming a non-fully sealed computer casing, wherein a fully sealed computer casing has a plurality of blowholes thereon to form the non-fully sealed computer casing, namely, not each faceplate of the non-fully sealed computer needs to match with each other exactly, the blowholes is mainly used for the transit of the airflow.

step 3303: disposing the electronic component needing to be cooled and the cooling apparatus with the air passage dispose within the computer casing, wherein the electronic component needing to be cooled is mounted on the corresponding position of the computer casing, the cooling apparatus is mounted on the electronic component, one end of the air passage communicates with the air outside the computer casing through the blowholes, the other end of the air passage communicates with the air inside the computer casing; the corresponding position has different standard and different mounting custom in different industry product, for example, the mainboard, the power supply, the hard disk and other parts in computer field respectively have a corresponding mounting position; the corresponding position also can be decided by the user of the cooling method; the electronic component needing to be cooled can be electronic element, chip or part; the heat dissipating part also can be a shell of the electronic component, the air passage directly integrates with the electronic component;

step 3304: achieving the running of the airflow between the interior and the exterior of the computer casing, wherein the airflow passes the air passage, at least one fan is mounted on the blowholes of the computer casing through a damping device or the wind pipe, or the fan is directly mounted on the blowholes of the computer casing; the fan is a mechanical fan with a diameter of 80 mm or a solid-state fan, wherein the mechanical fan uses the rotation of the fan blades to cause the airflow, the solid-state fan uses the corona phenomenon to cause the airflow; when the fan is a plurality of, the fans congruously blow air outside or inside to form an air pressure between the interior and the exterior of the computer casing so as to achieve the running of the airflow between the interior and the exterior of the computer casing, the airflow passes the air passage; the running of the airflow is that the airflow outside the computer casing inpours into the interior of the computer casing from the exterior of the computer casing through a part of the blowholes, and outpours out of the computer casing through the other part of the blowholes.

In the cooling method, there is no order between step 3301, step 3302, step 3303 and step 3304, the execution order is unlimited.

On a theoretical level, the experiment result of above embodiments proves that the cooling system and the cooling apparatuses has a good heat dissipating effect and the noise is obviously lower that the existing computer.

Moreover, because several fan-less cooling apparatuses of the cooling system use a common fan, a number of the mechanical fan which is easy to wear and tear is reduced, the reliability of the computer is improved while the noise is reduced. Further, the plug of the radiating fan inserts into the fan socket of the mainboard, such that the operation condition of the radiating fan can be monitored by the fan-monitoring function of the mainboard so as to ensure the reliability of the cooling system.

And the cooling system has a low-cost characteristic. First, because the leak tightness of the computer casing is better, the blowholes of the computer casing are less, such that the perforating process is reduced in the production process. Second, although the heat dissipating area of the fan-less cooling apparatus is larger, the more material is needed so as to increase the cost, but because they use a common fan so as to reduce the number of the fan, the cost is reduced. Third, the wind pipe of the fan-less cooling apparatus has a simple structure and a low cost, and the wind pipe contacts the computer casing with the flexible material so as to further reduce the requirement of the manufacture technics of the wind pipe. So the cooling system is a low-cost low-noise heat dissipating project.

The shape of the CPU fan-less cooling apparatus is not limited to above embodiments and the shapes shown in the drawings, wherein the radiator can be rectangular, polygonal and so on, the radiating fins can be vertical to or parallel to the electronic component needing to be cooled, the shield and the wind pipe can be rectangular, circular, polygonal and so on, the CPU fan-less cooling apparatus has the air passage and no fan is needed to mount. The computer casing is not limited to above embodiments and shapes shown in the drawings, the computer casing can be horizontal or other shape, the computer casing has the special blowholes used for the air passage and the special blowholes used for the fan thereon. The choice and the mounting position of the fan is shown in above embodiments and drawings, the number of the fan can be one or more, the noise is lower when one fan is mounted, the heat dissipating effect is better when a plurality of fans are mounted.

In above embodiments, there are two modes to form the air pressure difference between the interior and the exterior of the computer casing, the fan blow air outside or inside, the difference between two modes is only the airflow direction of the fan, in other words, the difference between two modes is only the mounting mode of the fan, but the corresponding heat dissipating effect is obviously different, therefore, if there is no special requirement, the mode that the fan blow air outside is preferred.

The cooling method not only is used for the computer, but also is used for other products, such as electronic product and communicating product, the heat dissipating effect is good and the noise is low.

One skilled in the art will understand that the embodiment of the present invention as shown in the drawings and described above is exemplary only and not intended to be limiting.

It will thus be seen that the objects of the present invention have been fully and effectively accomplished. Its embodiments have been shown and described for the purposes of illustrating the functional and structural principles of the present invention and they are subject to change without departure from such principles. Therefore, this invention includes all modifications encompassed within the spirit and scope of the following claims.

What is claimed is:

1. A cooling system for computer, comprising:
    a computer casing, at least one fan and at least one fan-less cooling apparatus;
    wherein said fan-less cooling apparatus has an air passage with two open ends and a closed circumference, said air passage passes a heat dissipating part of said fan-less cooling apparatus, one end of said air passage communicates with air outside said computer casing, and the other end of said air passage communicates with air inside said computer casing;
    said fan-less cooling apparatus is mounted on an electronic component needing to be cooled;
    said computer casing has a plurality of blowholes used for said fan and a plurality of blowholes used for said air passage;
    said fan blows air outside or inside through said blowholes used for said fan to cause an air pressure difference between an interior and an exterior of said computer casing, said air pressure difference leads an airflow to pass said air passage and said blowholes.

2. The cooling system, as recited in claim 1, wherein said heat dissipating part comprises a radiator, said radiator has said air passage disposed directly thereon.

3. The cooling system, as recited in claim 1, wherein said heat dissipating part comprises a radiator, and said air passage comprises a shield, said radiator comprises a plurality of radiating fins;
    said air passage has a plurality of channels, which is formed by said radiator and said shield, said radiating fins are positioned between said channels of said air passage.

4. The cooling system, as recited in claim 1, wherein said heat dissipating part comprises a radiator, and said air passage comprises a wind pipe, said air passage comprises a first air passage and a second air passage;
    said radiator has said first air passage disposed directly thereon;
    one end of said wind pipe communicates with said first air passage, the other end of said wind pipe communicates with the air outside said computer casing through said blowholes used for said air passage;
    said second air passage is formed by said wind pipe.

5. The cooling system, as recited in claim 1, wherein said heat dissipating part comprises a radiator, said air passage comprises a shield and a wind pipe, said radiator comprises a plurality of radiating fins, said air passage comprises a first air passage and a second air passage;

said first air passage has a plurality of channels, which is formed by said radiator and said shield, said radiating fins are positioned between said channels of said first air passage;

one end of said wind pipe communicates with said first air passage, the other end of said wind pipe communicates with the air outside said computer casing through said blowholes used for said air passage;

said second air passage is formed by said wind pipe.

6. The cooling system, as recited in claim 4, wherein a flange is disposed on the end of said wind pipe which communicates with the air outside said computer casing through said blowholes used for said air passage, a flexible material is affixed on said flange and contacts directly with an inner wall of said computer casing.

7. The cooling system, as recited in claim 6, wherein said wind pipe has a shape of cone, a bigger end of said cone communicates with the air outside said computer casing through said blowholes used for said air passage.

8. The cooling system, as recited in claim 1, wherein a flexible material is affixed on one end of said air passage which communicates with the air outside said computer casing.

9. The cooling system, as recited in claim 5, wherein said radiator comprises a plurality of radiating fins, a pedestal and a base board;

said pedestal has a shape of cone or cylinder;

said base board is cross-symmetrically disposed on said pedestal, and looks like X from top to bottom;

said radiating fins are disposed on said pedestal and said base board, and are parallel to said bisection planes of an angle with said base board;

said shield is disposed on an exterior of said radiator along an axle wire direction of said pedestal, and aligns with an edge of said radiator.

10. The cooling system, as recited in claim 5, wherein said radiator comprises a plurality of radiating fins, a base board and a plurality of heat pipes;

said radiating fins are vertical to said base board, and do not contact with said base board;

one segment of each heat pipe inserts into or enters into said base board, one segment of each heat pipe enters said radiating fins;

said shield is disposed on an exterior of said radiator along a direction of said base board, and aligns with an edge of said base board.

11. The cooling system, as recited in claim 4, wherein said radiator has a shape of cylinder;

around a central area of said columnar radiator, a plurality of pylomes are formed along a direction parallel to central line;

around said central area of said columnar radiator, a plurality of grooves are formed on an lower end of said columnar radiator and communicate with said pylomes;

said central area is positioned on a center of said columnar radiator and has an approximative dimension with a calorifacient area of the electronic component needing to be cooled;

the end of said wind pipe which communicates with said pylomes of said columnar radiator is disposed on an exterior of said columnar radiator along an axle wire direction of said columnar radiator, and aligns with an edge of said columnar radiator.

12. The cooling system, as recited in claim 5, wherein said radiator comprises a plurality of radiating fins, a base board and a plurality of heat pipes;

said radiating fins have a window on middle;

said radiating fins are parallel to said base board;

a middle segment of each heat pipe inserts into or enters into said base board, other segment of each heat pipe passes said radiating fins;

said shield inserts into said window of said radiating fins, a plurality of openings are formed on said shield, a number of shield is reduced along a direction of said shield which is far from said base board.

13. The cooling system, as recited in claim 3, wherein said shield is a coverplate, said radiator comprises a plurality of fins and a base board;

said radiating fins are disposed on said base board;

said coverplate is disposed on said radiating fins and is opposite to said base board;

said air passage has a plurality of channels, which is formed by said base board, said radiating fins and said coverplate.

14. The cooling system, as recited in claim 2, wherein said radiator is a radiating board, said radiating board has a plurality of pylomes thereon, said pylomes are said air passage.

15. The cooling system, as recited in claim 13, wherein said base board is a shell of a power supply.

16. The cooling system, as recited in claim 3, wherein said shield is a shell of a power supply, said radiator comprises a plurality of radiating fins and a base board;

said radiator is disposed on an inner wall of the shell of the power supply, said radiating fins are disposed on said base board, said base board is opposite to the shell of the power supply;

said air passage has a plurality of channels, which is formed by said radiator and the shell of the power supply.

17. The cooling system, as recited in claim 1, wherein said fan-less cooling apparatus comprises a hard disk fan-less cooling apparatus;

said hard disk fan-less cooling apparatus is a rectangular box, upper and lower surfaces of said rectangular box have no mouth, two opposite sides of said rectangular box respectively have a first mouth, a hard disk inserts into said rectangular box through said first mouth, the other two opposite sides of said rectangular box respectively have a second mouth having a height more than a thickness of the hard disk;

said air passage of said hard disk fan-less cooling apparatus is formed by said upper and lower surfaces of said rectangular box and surfaces of the hard disk.

* * * * *